(12) United States Patent
Hao et al.

(10) Patent No.: US 11,295,652 B2
(45) Date of Patent: Apr. 5, 2022

(54) SHIFT REGISTER UNIT, SHIFT REGISTER AND DRIVING METHOD, AND DISPLAY APPARATUS

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Xueguang Hao, Beijing (CN); Jianbo Xian, Beijing (CN); Yong Qiao, Beijing (CN); Xinyin Wu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/954,503

(22) PCT Filed: Nov. 19, 2019

(86) PCT No.: PCT/CN2019/119380
§ 371 (c)(1),
(2) Date: Jun. 16, 2020

(87) PCT Pub. No.: WO2020/108344
PCT Pub. Date: Jun. 4, 2020

(65) Prior Publication Data
US 2021/0166600 A1 Jun. 3, 2021

(30) Foreign Application Priority Data
Nov. 26, 2018 (CN) .......................... 201821954354.X

(51) Int. Cl.
*G09G 3/20* (2006.01)

(52) U.S. Cl.
CPC ....... *G09G 3/20* (2013.01); *G09G 2310/0267* (2013.01); *G09G 2310/0286* (2013.01); *G09G 2310/08* (2013.01)

(58) Field of Classification Search
CPC ............... G09G 2310/0286; G09G 2310/0267
See application file for complete search history.

(56) References Cited

U.S. PATENT DOCUMENTS

2016/0267864 A1* 9/2016 Xiao .................... G09G 3/3677
2020/0273419 A1* 8/2020 Wang ................... G09G 3/3677

FOREIGN PATENT DOCUMENTS

| CN | 103280196 A | 9/2013 |
| CN | 107068106 A | 8/2017 |

(Continued)

OTHER PUBLICATIONS

International Search Report in Application No. PCT/CN2019/119380, dated Feb. 28, 2020.

*Primary Examiner* — Laurence J Lee
(74) *Attorney, Agent, or Firm* — Syncoda LLC; Feng Ma

(57) ABSTRACT

A shift register unit can include a storage circuit and an output circuit respectively connected to a pull-up node, a gate electrode driving signal output terminal, and an output voltage signal input terminal, and can connect or disconnect the gate electrode driving signal output terminal and the output voltage signal input terminal under the control of electric potential of the pull-up node; the storage circuit can be respectively connected to the pull-up node and the gate electrode driving signal output terminal and can control the electric potential of the pull-up node during the gate electrode driving signal output stage, such that the output circuit can connect the gate electrode driving signal output terminal and the output voltage signal input terminal. During a gate electrode driving signal output stage, the electric potential of (Continued)

the pull-up node can be maintained, such that gate electrode driving signals can be outputted normally.

18 Claims, 21 Drawing Sheets

(56) References Cited

FOREIGN PATENT DOCUMENTS

| | | | |
|---|---|---|---|
| CN | 107424552 | A | 12/2017 |
| CN | 108682380 | A | 10/2018 |

* cited by examiner

SHIFT REGISTER UNIT, SHIFT REGISTER AND DRIVING METHOD, AND DISPLAY APPARATUS

CROSS-REFERENCE TO RELATED APPLICATIONS

The present application is a national stage of International Application No. PCT/CN2019/119380 filed on Nov. 19, 2019, which claims priority to Chinese Patent Application No. 201821954354.X filed on Nov. 28, 2018. The disclosures of these applications are hereby incorporated by reference in their entirety.

TECHNICAL FIELD

The present disclosure relates generally to a field of display technologies, and specifically to a shift register unit, a gate electrode driving circuit and a display apparatus.

BACKGROUND

In gate electrode driving circuits in existing technologies, a pull-up node and an electrode plate that maintains capacitance with the pull-up node can be connected to a low voltage terminal, as a result, during an output stage, the capacitance of the pull-up node can be held up and thus will not contribute to the increase of the electric potential of the pull-up node, only the electric potential of the gate electrode of the output transistor can be held up, because the electric potential of the gate electrode driving signal output terminal can be increased to become high electric potential at this time, the output transistor can be shut off by mistake, the output of the gate electrode driving signal can therefore be negatively impacted.

SUMMARY

Various embodiments of the present disclosure provide a shift register unit, a gate electrode driving circuit and a display apparatus, which can solve the problems such as unstable output of gate electrode driving signals.

In a first aspect of the present disclosure, a shift register unit can be provided.

The shift register unit can include:

an output circuit; and a storage circuit;

wherein:

the output circuit is respectively connected to a pull-up node, a gate electrode driving a signal output terminal, the signal output terminal being connected to a pull-down node, and an output voltage signal input terminal, the output circuit being configured to connect or disconnect the gate electrode driving signal output terminal and the output voltage signal input terminal under the control of the electric potential of the pull-up node;

the storage circuit is respectively connected to the pull-up node and the gate electrode driving signal output terminal; and the storage circuit is configured to control the electric potential of the pull-up node during the gate electrode driving voltage output stage, such that the output circuit can connect the gate electrode driving signal output terminal and the output voltage signal input terminal.

In some embodiments:

the storage circuit comprises a first storage capacitor;

the first terminal of the first storage capacitor is connected to the pull-up node; and the second terminal of the first storage capacitor is connected to the gate electrode driving signal output terminal.

In some embodiments, the shift register can further include:

a pull-down node reset circuit, the pull-down node reset circuit being respectively connected to the pull-down node, the gate electrode driving signal output terminal, and the pull-down reset voltage input terminal;

wherein the pull-down node reset circuit is configured to connect or disconnect the pull-down reset voltage input terminal and the pull-down node under the control of the gate electrode driving signal output terminal.

In some embodiments:

the pull-down node reset circuit further includes a pull-down node reset transistor;

wherein:

the gate electrode of the pull-down node reset transistor is connected to the gate electrode driving signal output terminal, wherein the first electrode of the pull-down node reset transistor is connected to the pull-down node; and wherein the second electrode of the pull-down node reset transistor is connected to the pull-down rest voltage input terminal.

In some embodiments:

the output circuit comprises an output transistor, wherein the gate electrode of the output transistor is connected to the pull-up node;

the first electrode of the output transistor is connected to the output voltage signal input terminal; and the second electrode of the output transistor is connected to the gate electrode driving signal output terminal.

In some embodiments, the output voltage signal input terminal is an output clock signal input terminal.

In some embodiments, the shift register unit can further include:

an output reset circuit;

a pull-up node control circuit; and a pull-down node control circuit;

wherein:

the output reset circuit is respectively connected to the pull-down node, the gate electrode driving signal output terminal and the first voltage input terminal, it is utilized to connect or disconnect the gate electrode driving circuit output terminal and the first voltage input terminal under the control of electric potential of the pull-down node;

the pull-up node control circuit is connected to the pull-up node, it is utilized to control the electric potential of the pull-up node; and the pull-down node control circuit is connected to the pull-down node, it is utilized to control the electric potential of the pull-down node.

In some embodiments:

the pull-up node control circuit is further respectively connected to the pull-down node, an adjacent upper level gate electrode driving signal output terminal, an adjacent lower level gate electrode driving signal output terminal, and a forward scan control terminal and a reverse scan control terminal; and the pull-up node control circuit is configured to connect or disconnect the pull-up node and the first voltage input terminal under the control of the pull-down node, connect or disconnect the forward scan control terminal and the pull-up node under the control of the adjacent upper level gate driving signal output terminal, and connect or disconnect the reverse scan control terminal and the pull-up node under the control of the adjacent lower level gate driving signal output terminal.

In some embodiments:

the pull-up node control circuit comprises a first pull-up control transistor, a second pull-up control transistor, and a third pull-up control transistor;

the gate electrode of the first pull-up control transistor is connected to the adjacent upper level gate electrode driving signal output terminal;

the first electrode of the first pull-up control transistor is connected to the pull-up node;

the second electrode of the first pull-up control transistor is connected to the forward scan control terminal;

the gate electrode of the second pull-up control transistor is connected to the lower level gate electrode driving signal output terminal;

the first electrode of the second pull-up control transistor is connected to the reverse scan control terminal;

the second electrode of the second pull-up control transistor is connected to the pull-up node;

the gate electrode of the third pull-up control transistor is connected to the pull-down node;

the first electrode of the third pull-up control transistor is connected to the pull-up node; and the second electrode of the third pull-up control transistor is connected to the first voltage input terminal.

In some embodiments:

the pull-down node control circuit is further connected to the pull-up node, the forward scan control terminal, the forward scan clock signal input terminal, the reverse scan control terminal, the reverse scan clock signal input terminal, the first voltage input terminal, and the second voltage input terminal;

the pull-down node control circuit is configured to connect or disconnect the forward scan clock signal input terminal and the pull-down control node under the control of the forward scan control terminal, connect or disconnect the reverse scan clock signal input terminal and the pull-down control node under the control of the reverse scan control terminal, connect or disconnect the pull-down node and the second voltage input terminal under the control of the electric potential of the pull-down control node, and connect or disconnect the pull-down node and the first voltage input terminal under the control of the pull-up node.

In some embodiments:

the pull-down node control circuit comprises a first pull-down control transistor, a second pull-down control transistor, a third pull-down control transistor and a fourth pull-down control transistor;

the gate electrode of the first pull-down control transistor is connected to the forward scan control terminal;

the first electrode of the first pull-down control transistor is connected to the forward scan clock signal input terminal;

the second electrode of the first pull-down control transistor is connected to the pull-down control node;

the gate electrode of the second pull-down control transistor is connected to the reverse scan control terminal;

the first electrode of the second pull-down control transistor is connected to the reverse scan clock signal input terminal;

the second electrode of the second pull-down control transistor is connected to the pull-down control node;

the gate electrode of the third pull-down control transistor is connected to the pull-down control node;

the first electrode of the third pull-down control transistor is connected to the pull-down node;

the second electrode of the third pull-down control transistor is connected to the second voltage input terminal;

the gate electrode of the fourth pull-down control transistor is connected to the pull-up node;

the first electrode of the fourth pull-down control transistor is connected to the first voltage input terminal; and the second electrode of the fourth pull-down control transistor is connected to the pull-down node.

In some embodiments, the output reset circuit includes:

an output reset transistor, wherein a gate electrode of the output reset transistor is connected to the pull-down node, wherein a first electrode of the output reset transistor is connected to the gate electrode driving signal output terminal, wherein a second electrode of the output reset transistor is connected to the first voltage input terminal; and a second storage capacitor, wherein a first terminal of the second storage capacitor is connected to the pull-down node, and wherein a second terminal of the second storage capacitor is connected to the first voltage input terminal.

In another aspect, a gate electrode driving circuit is provided, including a plurality of levels of shift register units, each shift level unit being provided in accordance with the shift register unit described above.

In another aspect, a display apparatus is provided, including the gate electrode driving circuits described above.

In some embodiments:

the pull-down node reset circuit also includes a holding capacitor being provided between a signal side and an electrical connection side of the pull-down node;

and the holding capacitor is configured to maintain an output potential of the output transistor.

In some embodiments:

the pull-down node reset circuit also includes a holding capacitor being provided between a signal side and an electrical connection side of the pull-down node; and the holding capacitor is configured to maintain an output potential of the output transistor.

In some embodiments, the shift register unit further includes an output reset circuit provided connected between the pull-down node and the gate electrode driving a signal output terminal.

In some embodiments, the shift register unit further includes:

a pull-down node control circuit operatively connected to the output reset circuit, the pull-down-node, and a pull-up node control circuit, the pull-up node control circuit being operatively connected to the output circuit and the pull-up node.

In some embodiments, the pull-down node control circuit is connected to a forward scan control, the forward scan control terminal being provided at an input side of the pull-up node control unit.

In some embodiments, the pull-down node control circuit is connected between the pull-down node and a reverse scan control terminal, the reverse scan control terminal being provided at an input side of the pull-up node control unit independent from the forward scan control terminal.

In some embodiments, the pull-down node control circuit is connected to a reverse scan control terminal, the reverse scan control terminal being provided at an input side of the pull-up node control unit.

In some embodiments:

the shift register unit is provided with a first input clock terminal, a second input clock terminal, a third input clock terminal, and a fourth input clock terminal, wherein the forward scan clock signal input terminal can be the third clock signal input terminal;

the reverse scan clock signal input terminal is the first clock signal input terminal;

the first voltage input terminal is a low voltage terminal; and the second voltage input terminal can be a high voltage terminal.

In some embodiments:

the first input clock terminal is configured to receive input regarding a first clock signal;

the second input clock terminal is configured to receive input regarding a second clock signal;

the third input clock terminal is configured to receive input regarding a third clock signal; and wherein the fourth input clock terminal is configured to receive input regarding a fourth clock signal.

In some embodiments:

the period of the first clock signal, the period of the second clock signal, the period of the third clock signal, and the period of the fourth clock signal are equal, and a total period is defined as T; and the duty ratio of the first clock signal, the duty ratio of the second clock signal, the duty ratio of the third clock signal and the duty ratio of the fourth clock signal are all ¼ T.

In some embodiments:

the second clock signal is delayed by T/4 compared with the first clock signal;

the third clock signal is delayed by T/4 compared with the second clock signal; and the fourth clock signal is delayed by T/4 compared with the third clock signal.

It is to be understood that both the above general description and the following detailed description are exemplary and explanatory only and are not restrictive of the present disclosure.

BRIEF DESCRIPTION OF DRAWINGS

To more clearly illustrate some of the embodiments, the following is a brief description of the drawings.

The drawings in the following descriptions are only illustrative of some embodiments. For those of ordinary skill in the art, other drawings of other embodiments can become apparent based on these drawings.

DETAILED DESCRIPTION

Figure 1:
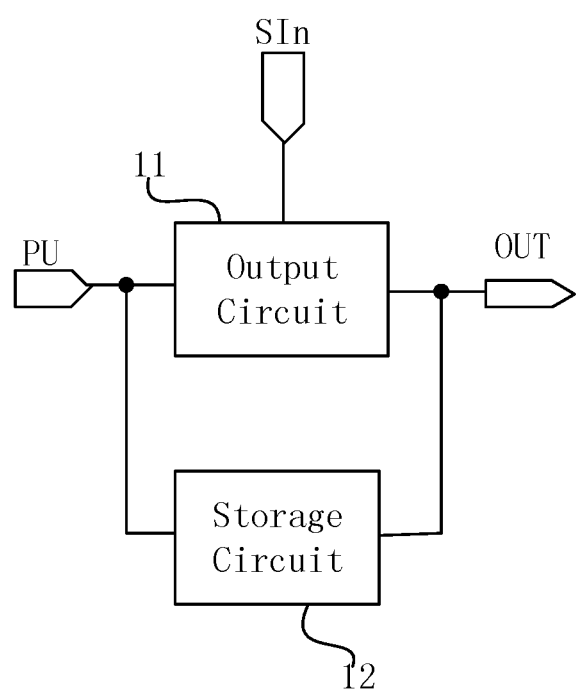
FIG. 1 illustrates a structural diagram of a shift register unit according to some embodiments of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. can be used herein to describe various elements, these elements should not be limited by these terms. These terms are only used to distinguish one element from another. For example, a first element could be termed a second element, and, similarly, a second element could be termed a first element, without departing from the scope of to the present disclosure. As used herein, the term "and/or" includes any and all combinations of one or more of the associated listed items.

It will be understood that when an element such as a layer, region, or other structure can be referred to as being "on" or extending "onto" another element, it can be directly on or extend directly onto the other element or intervening elements can also be present. In contrast, when an element is referred to as being "directly on" or extending "directly onto" another element, there are no intervening elements present.

Likewise, it will be understood that when an element such as a layer, region, or substrate can be referred to as being "over" or extending "over" another element, it can be directly over or extend directly over the other element or intervening elements can also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Relative terms such as "below" or "above" or "upper" or "lower" or "horizontal" or "horizontal" can be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Various embodiments of the present disclosure provide a shift register unit, a gate electrode driving circuit and a display apparatus. The shift register unit can include an output circuit and a storage circuit; the output circuit can be respectively connected to a pull-up node, a gate electrode driving signal output terminal and output voltage signal input terminal, it can be utilized to connect or disconnect the gate electrode driving signal output terminal and the output voltage signal input terminal under the control of electric potential of the pull-up node; the storage circuit can be respectively connected to the pull-up node and the gate electrode driving signal output terminal, it can be utilized to control the electric potential of the pull-up node during the gate electrode driving signal output stage, such that the output circuit can connect the gate electrode driving signal output terminal and the output voltage signal input terminal. During a gate electrode driving signal output stage, the electric potential of the pull-up node can be maintained, such that gate electrode driving signals can be outputted normally.

It should be understood, the transistors according to embodiments of the present disclosure can be thin film transistors or transverse-field transistors or other components with same characteristics. In the present disclosure, in order to distinguish the two electrodes of a transistor other than the gate electrode, one electrode can be described as the first electrode, while an alternative electrode can be described as the second electrode. In practical operations, the first electrode can be a drain electrode, the second electrode can be a source electrode; or, the first electrode can be a source electrode, the second electrode can be a drain electrode.

In a first aspect, a shift register unit can be provided, such as the shift register illustrated in FIG. 1, wherein the shift register unit according to embodiments of the present disclosure can include an output circuit 11 and a storage circuit 12.

The output circuit 11 can be respectively connected to a pull-up node PU, a gate electrode driving signal output terminal OUT, and an output voltage signal input terminal Sin. In this manner, the output circuit 11 can be utilized to connect or disconnect the gate electrode driving signal output terminal OUT, and the output voltage signal input terminal SIn under the control of the electric potential of the pull-up node PU.

The storage circuit 12 can be respectively connected to the pull-up node PU and the gate electrode driving signal output terminal OUT. In this manner the storage circuit 12 can be utilized to control the electric potential of the pull-up node PU during a gate electrode driving signal output stage, such that the output circuit 11 can connect the gate electrode driving signal output terminal OUT and the output voltage signal input terminal SIn.

According to embodiments of the present disclosure, the second terminal of the storage circuit 12 can be provided to be connected to the gate electrode driving signal output terminal OUT, such that the electric potential of the pull-up node PU can be maintained during a gate electrode driving signal output stage, such that a gate electrode driving signal can be outputted normally.

According to embodiments of the present disclosure, one terminal of the storage circuit 12 can be electrically connected to the pull-up node PU, while the other terminal of the storage circuit 12 can be electrically connected to the gate electrode driving signal output terminal OUT. In practical operations, the storage circuit 12 can include a first storage capacitor, and when the gate electrode driving signal output terminal OUT outputs high electric potential, because of the bootstrap function of the first storage capacitor during the gate electrode driving signal output stage, the electric potential of the pull-up node PU can be increased continuously.

In this manner, the source-gate voltage of the output transistor included in the output circuit can become larger, such that the output transistor can be turned on, and the output transistor will not be mistakenly turned off because of the gradual increase of the voltage of the gate electrode driving signal output terminal OUT. Ultimately, this results in increased maintained stability of the gate electrode driving output voltage.

In some embodiments, the output voltage signal input terminal SIn can be an output clock signal input terminal, however, this arrangement is made by way of example only, and those having skill in the art will recognize alternative applications, components, and arrangements and as such no limitations are intended thereby.

Figure 2:
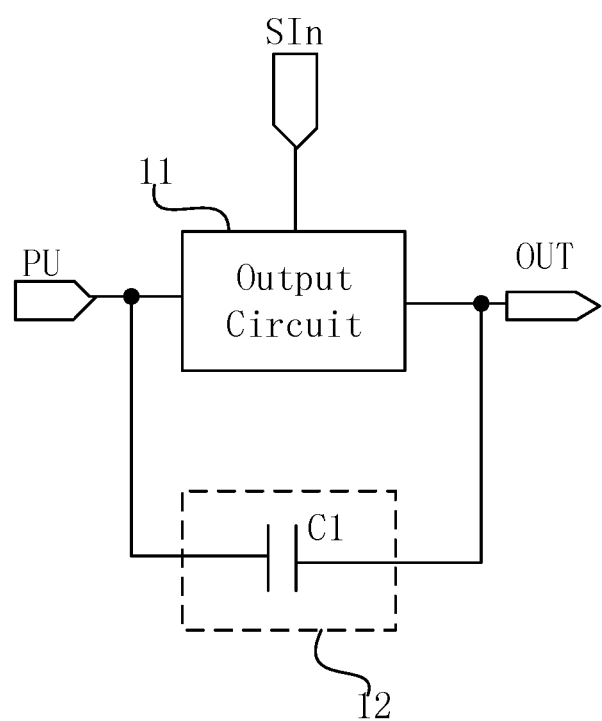
FIG. 2 illustrates a structural diagram of another shift register unit according to some other embodiments of the present disclosure.

As illustrated in FIG. 2, the storage circuit 12 can include a first storage capacitor C1, wherein the first terminal of the first storage capacitor C1 can be connected to the pull-up node PU, and the second terminal of the first storage capacitor C1 can be connected to the gate electrode driving signal output terminal OUT.

In some embodiments, the shift register unit according to embodiments of the present disclosure can further include a pull-down node reset circuit, wherein the shift register can be respectively connected to the pull-down node, the gate electrode driving signal output terminal, and the pull-down reset voltage input terminal. In this manner, the shift register unit can be utilized to connect or disconnect the pull-down node and the pull-down reset voltage input terminal under the control of the gate electrode driving signal output terminal.

Figure 3:
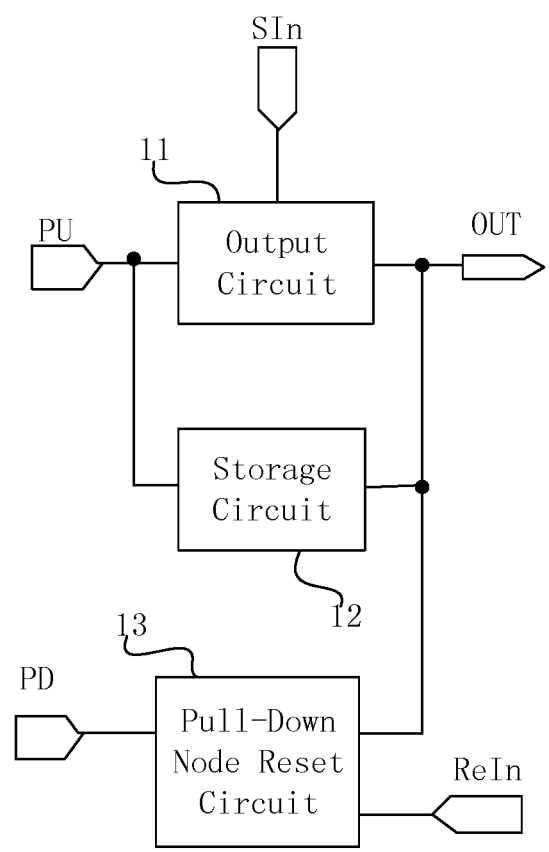
FIG. 3 illustrates a structural diagram of yet another shift register unit according to yet some other embodiments of the present disclosure.

As illustrated in FIG. 3, on the basis of the embodiment of the shift register unit as illustrated in FIG. 1, the shift register unit according to embodiments of the present disclosure can further include a pull-down node reset circuit 13, wherein the shift register unit can be respectively connected to the pull-down node PD, the gate electrode driving signal output terminal OUT, and the pull-down reset voltage input terminal ReIn.

In this manner, the shift register unit can be utilized to connect or disconnect the pull-down node PD and the pull-down reset voltage input terminal ReIn under the control of the gate electrode driving signal output terminal OUT.

The pull-down node reset circuit 13 can then be utilized so as to ensure the voltage of the pull-down node PD and can be a dead voltage during the gate electrode driving signal output stage, such that the corresponding output reset transistor can be turned off, the outputting of gate electrode driving signal will not be influenced.

A dead voltage refers to a voltage than can turn off a transistor which gate electrode can be connected to the voltage source.

In some embodiments, the pull-down reset voltage terminal ReIn to can be a low voltage terminal, however, this arrangement is made by way of example only, and those having skill in the art will recognize alternative applications, components, and arrangements and as such no limitations are intended thereby.

In some embodiments, the pull-down node reset circuit can include a pull-down node reset transistor.

The gate electrode of the pull-down node reset transistor can be connected to the gate electrode driving signal output terminal, the first electrode of the pull-down node reset transistor can be connected to the pull-down node, the second electrode of the pull-down node reset transistor can be connected to the pull-down reset voltage input terminal.

Figure 4:
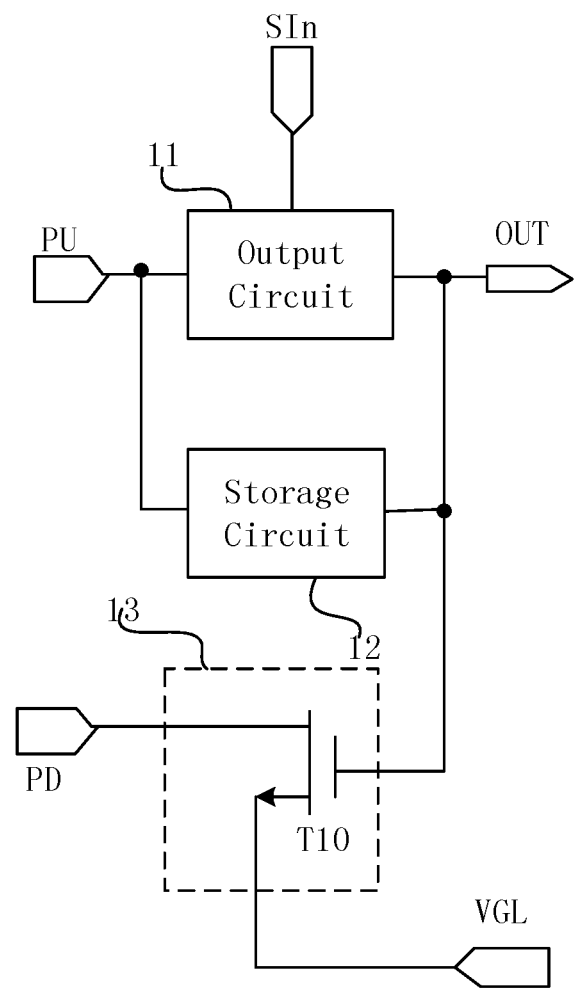
FIG. 4 illustrates a structural diagram of yet another shift register unit according to yet some other embodiments of the present disclosure.

As illustrated in FIG. 4, on the basis of the shift register unit illustrated in FIG. 3, the pull-down node reset circuit 13 can include a pull-down node reset transistor T10. In such an embodiment, the gate electrode of the pull-down node reset transistor T10 can be connected to the gate electrode driving signal output terminal OUT, wherein the drain electrode of the pull-down node reset transistor T10 can be connected to the pull-down node PD, and wherein the source electrode of the pull-down node reset transistor T10 can be connected to the low voltage terminal. In this manner, the low voltage terminal can be utilized to input a low voltage VGL.

In the embodiments illustrated in FIG. 4, T10 can be provided as an n-type transistor, however, this arrangement is made by way of example only, and those having skill in the art will recognize alternative applications, components, and arrangements and as such no limitations are intended thereby.

In the embodiments illustrated in FIG. 4, the pull-down reset voltage input terminal can be provided as a low voltage terminal, however, this arrangement is made by way of example only, and those having skill in the art will recognize alternative applications, components, and arrangements.

During the working process of the shift register unit according to embodiments of the present disclosure as illustrated in FIG. 4, during the gate electrode driving signal output stage, the gate electrode driving signal output terminal OUT can output high electric potential. In this manner, the pull-down node reset transistor T10 can turned on and the pull-down node PD can be connected to the low voltage VGL, such that the output reset transistor which the gate electrode is connected to PD can be turned off. As a result, the output of the gate electrode driving signal can be maintained or otherwise not be influenced.

In some embodiments, the output circuit can include an output transistor, wherein the gate electrode of the output transistor can be connected to the pull-up node. The first electrode of the output transistor can then be connected to the output voltage signal input terminal, wherein the second electrode of the output transistor can be connected to the gate electrode driving signal output terminal.

In some embodiments, the output voltage signal input terminal can be an output clock signal input terminal, however, as discussed above, this arrangement is made by way of example only, and those having skill in the art will recognize alternative applications, components, and arrangements and as such no limitations are intended thereby.

In some embodiments, the shift register unit can further include an output reset circuit, a pull-up node control circuit and a pull-down node control circuit, wherein the output reset circuit can be respectively connected to the pull-down node, the gate electrode driving signal output terminal and the first voltage input terminal. The output reset circuit can then be utilized to connect or disconnect the gate electrode driving signal output terminal and the first voltage input terminal under the control of electric potential of the pull-down node.

In some additional embodiments, the pull-up node control circuit can be connected to the pull-up node, wherein the pull-up node control can be utilized to control the electric potential of the pull-up node. In such embodiments, the pull-down node control circuit can be connected to the pull-down node, such that the pull-down node control circuit can be utilized to control the electric potential of the pull-down node.

In some embodiments, the pull-up node control circuit can further be respectively connected to the pull-down node, the adjacent upper level gate electrode driving signal output terminal, the adjacent lower level gate electrode driving signal output terminal, the forward scan control terminal, and the reverse scan control terminal. In such embodiments, the pull-up node control circuit can then be utilized to connect or disconnect the pull-up node and the first voltage input terminal under the control of the pull-down node, connect or disconnect the forward scan control terminal and the pull-up node under the control of the adjacent upper level gate electrode driving signal output terminal, and connect or disconnect the reverse scan control terminal and the pull-up node under the control of the adjacent lower level gate electrode driving signal output terminal.

A gate electrode driving circuit including the shift register units according to embodiments of the present disclosure can be configured so as to conduct forward scanning and reverse scanning under the control of the forward scan control terminal and the reverse scan control terminal.

Figure 5:
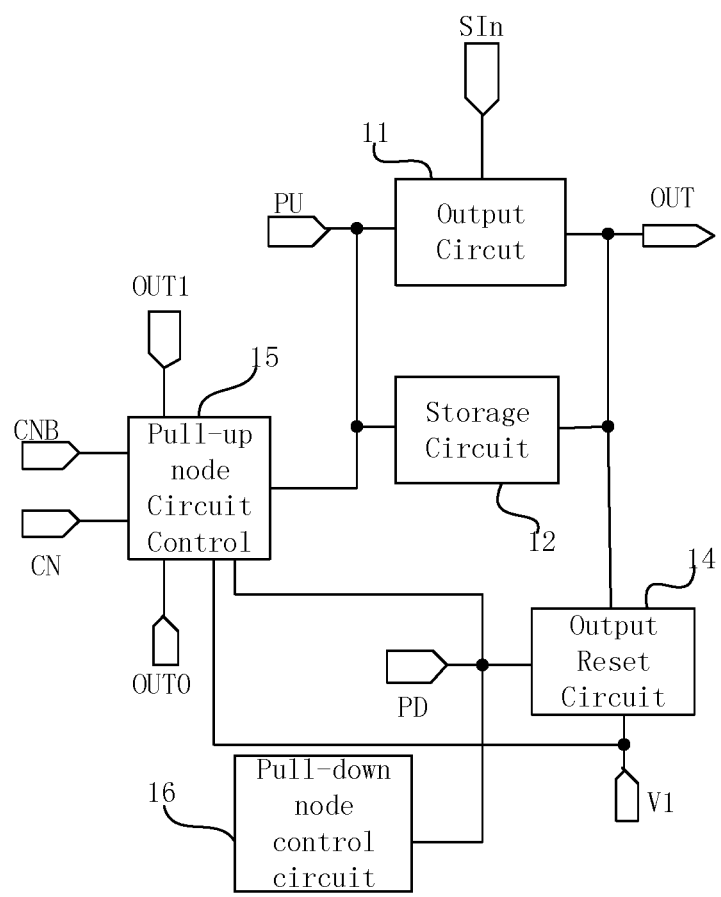
FIG. 5 illustrates a structural diagram of yet another shift register unit according to yet some other embodiments of the present disclosure.

As illustrated in FIG. 5, on the basis of the embodiment of the shift register unit illustrated in FIG. 1, the shift register unit according to embodiments of the present disclosure can further include a reset circuit 14, a pull-up node control circuit 15, and a pull-down node control circuit 16.

In such embodiments, the output reset circuit 14 can be respectively connected to the pull-down node PD, the gate electrode driving signal output terminal OUT, and the first voltage input terminal V1. The output reset circuit 14 can then be utilized to connect or disconnect the gate electrode driving signal output terminal OUT and the first voltage input terminal V1 under the control of electric potential of the pull-down node PD.

In some such embodiments, the pull-up node control circuit 15 can be respectively connected to the pull-down node PD, the first voltage input terminal V1, the adjacent upper level gate electrode driving signal output terminal OUT0, the adjacent lower level gate electrode driving signal output terminal OUT1, the forward scan control terminal CN, and the reverse scan control terminal CNB. The pull-up node control circuit 15 can then be utilized to connect or disconnect the pull-up node PU and the first voltage input terminal V1 under the control of the pull-down node PD, connect or disconnect the forward scan control terminal CN and the pull-up node PU under the control of the adjacent upper level gate electrode driving signal output terminal OUT0, and connect or disconnect the reverse scan control terminal CNB and the pull-up node PU under the control of the adjacent lower level gate electrode driving signal output terminal OUT1;

In some embodiments, the pull-down node control circuit 16 can be connected to the pull-down node PD, wherein the pull-down node control circuit 16 can be utilized to control the electric potential of the pull-down node PD.

In some embodiments, the first voltage input terminal V1 can be a low voltage terminal, however, this arrangement is made by way of example only, and those having skill in the art will recognize alternative applications, components, and arrangements and as such no limitations are intended thereby.

During the working process of the shift register unit according to embodiments of the present disclosure, during forward scanning stage, CN can output a high electric potential, wherein CNB can output low electric potential, when OUT0 outputs high electric potential, the pull-up node control circuit 15 can control the pull-up node PU and the forward scan control terminal CN to be connected to each other, such that the electric potential of PU can be pulled up. Further, during reverse scanning stage, CN can output a low electric potential, wherein CNB can output high electric potential, when OUT1 outputs high electric potential, the pull-up node control circuit 15 can control the pull-up node PU and the reverse scan control terminal CNB to be connected to each other, such that the electric potential of PU can be pulled up.

In some embodiments, the pull-up node control circuit can include a first pull-up control transistor, a second pull-up control transistor, and a third pull-up control transistor.

In some such embodiments, the gate electrode of the first pull-up control transistor can be connected to the upper level gate electrode driving signal output terminal, the first electrode of the first pull-up control transistor can be connected to the pull-up node, and the second electrode of the first pull-up control transistor can be connected to the forward scan control terminal.

Further, the gate electrode of the second pull-up control transistor can be connected to the lower level gate electrode driving signal output terminal, the first electrode of the second pull-up control transistor can be connected to the reverse scan control terminal, and the second electrode of the second pull-up control transistor can be connected to the pull-up node. Additionally, the gate electrode of the third pull-up control transistor can be connected to the pull-down node, the first electrode of the third pull-up control transistor can be connected to the pull-up node, and the second electrode of the third pull-up control transistor can be connected to the first voltage input terminal.

In practical operations, the pull-down node control circuit can be connected to the pull-up node, the forward scan control terminal, the forward scan clock signal input terminal, the reverse scan control terminal, the reverse scan clock signal input terminal, the first voltage input terminal, and the second voltage input terminal.

In such embodiments, the pull-down node control circuit can be utilized to connect or disconnect the forward scan clock signal input terminal and the pull-down control node under the control of the forward scan control terminal, connect or disconnect the reverse scan clock signal input terminal and the pull-down control node under the control of the reverse scan control terminal, connect or disconnect the pull-down node and the second voltage input terminal under the control of the electric potential of the pull-down control node, and connect or disconnect the pull-down node and the first voltage input terminal under the control of the pull-up node.

Figure 6:
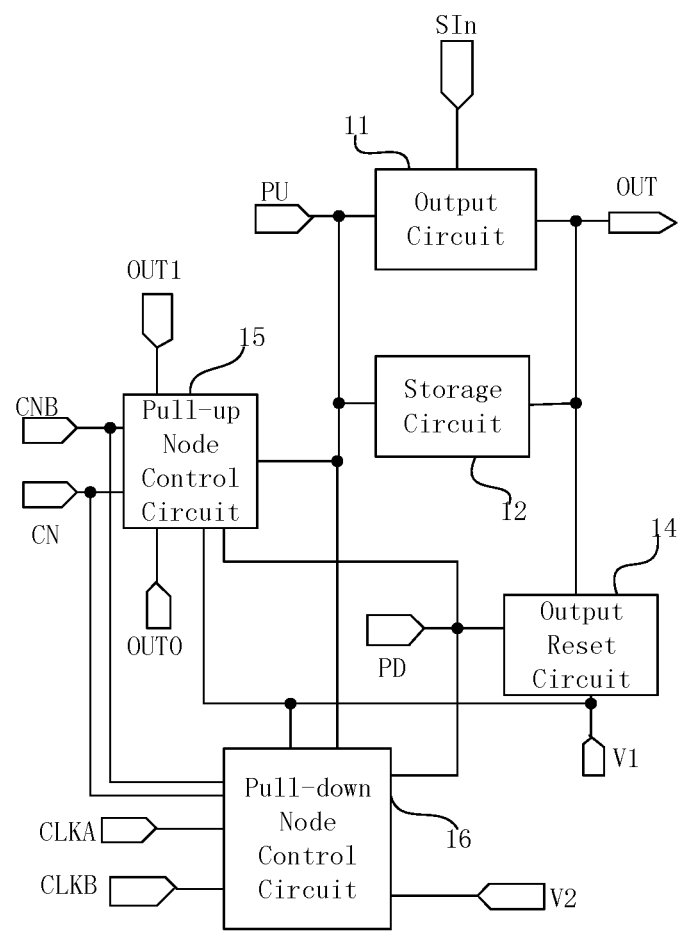
FIG. 6 illustrates a structural diagram of yet another shift register unit according to yet some other embodiments of the present disclosure.

As illustrated in FIG. 6, on the basis of the shift register unit according to embodiments of the present disclosure as illustrated in FIG. 5, the pull-down node control circuit 16 can further be connected to the pull-up node PU, the forward scan control terminal CN, the forward scan clock signal input terminal CLKA, the reverse scan control terminal CNB, the reverse scan clock signal input terminal CLKB, the first voltage input terminal V1, and the second voltage input terminal V2.

In this manner, the shift register unit can be utilized to connect or disconnect the forward scan clock signal input terminal CLKA and the pull-down control node PDCN under the control of the forward scan control terminal CN, connect or disconnect the reverse scan clock signal input terminal CLKB and the pull-down control node PDCN under the control of the reverse scan control terminal CNB, connect or disconnect the pull-down node PD and the second voltage input terminal V2 under the control of the electric potential of the pull-down control node PDCN, and connect or disconnect the pull-down node PD and the first voltage input terminal V1 under the control of the pull-up node PU.

In some embodiments, the first voltage input terminal V1 can be a low voltage terminal, the second voltage terminal V2 can be a high voltage terminal, however, this arrangement is made by way of example only, and those having skill in the art will recognize alternative applications, components, and arrangements and as such no limitations are intended thereby.

During the working process of the shift register unit, according to embodiments of the present disclosure as illustrated in FIG. 6, during the forward scanning stage, CN can output high electric potential, CNB can output low electric potential, then under the control of CN, the pull-down node control circuit 16 can control the PDCN and CLKA to be connected to each other.

When CLKA inputs high electric potential, under the control of the PDCN, the pull-down node control circuit 16 can control the pull-down node PD and the second voltage input terminal V2 to be connected to each other. During the reverse scanning stage, CN can output low electric potential, CNB can output high electric potential, under the control of CNB, the pull-down node control circuit 16 can control the PDCN and CLKB to be connected to each other, when CLKB inputs high electric potential, then under the control of PDCN, the pull-down node control circuit 16 can control the pull-down node PD and the second voltage input terminal V2 to be connected to each other.

In some embodiments, the pull-down node control circuit can include a first pull-down control transistor, a second pull-down control transistor, a third pull-down control transistor, and a fourth pull-down control transistor.

In such embodiments, the gate electrode of the first pull-down control transistor can be connected to the forward scan control terminal, wherein the first electrode of the first pull-down control transistor can be connected to the forward scan clock signal input terminal, and wherein the second electrode of the first pull-down control transistor can be connected to the pull-down control node. Further, the gate electrode of the second pull-down control transistor can be connected to the reverse scan control terminal, the first electrode of the second pull-down control transistor can be connected to the reverse scan clock signal input terminal, and the second electrode of the second pull-down control transistor can be connected to the pull-down control nod.

Additionally, the gate electrode of the third pull-down control transistor can be connected to the pull-down control node, the first electrode of the third pull-down control transistor can be connected to the pull-down node, and the second electrode of the third pull-down control transistor can be connected to the second voltage input terminal.

Finally, the gate electrode of the fourth pull-down control transistor can be connected to the pull-up node, the first electrode of the fourth pull-down control transistor can be connected to the first voltage input terminal, and the second electrode of the fourth pull-down control transistor can be connected to the pull-down node.

In some embodiments, the output reset circuit can include: an output reset transistor having a gate electrode which can be connected to the pull-down node, wherein a first electrode of the output reset transistor can be connected to the gate electrode driving signal output terminal, and wherein a second electrode of the output reset transistor can be connected to the first voltage input terminal; a second storage capacitor, wherein a first terminal of the second storage capacitor can be connected to the pull-down node, and wherein a second terminal of the second storage capacitor can be connected to the first voltage input terminal.

In the following, the shift register unit according to embodiments of the present disclosure will be described through specific embodiments.

Figure 7:
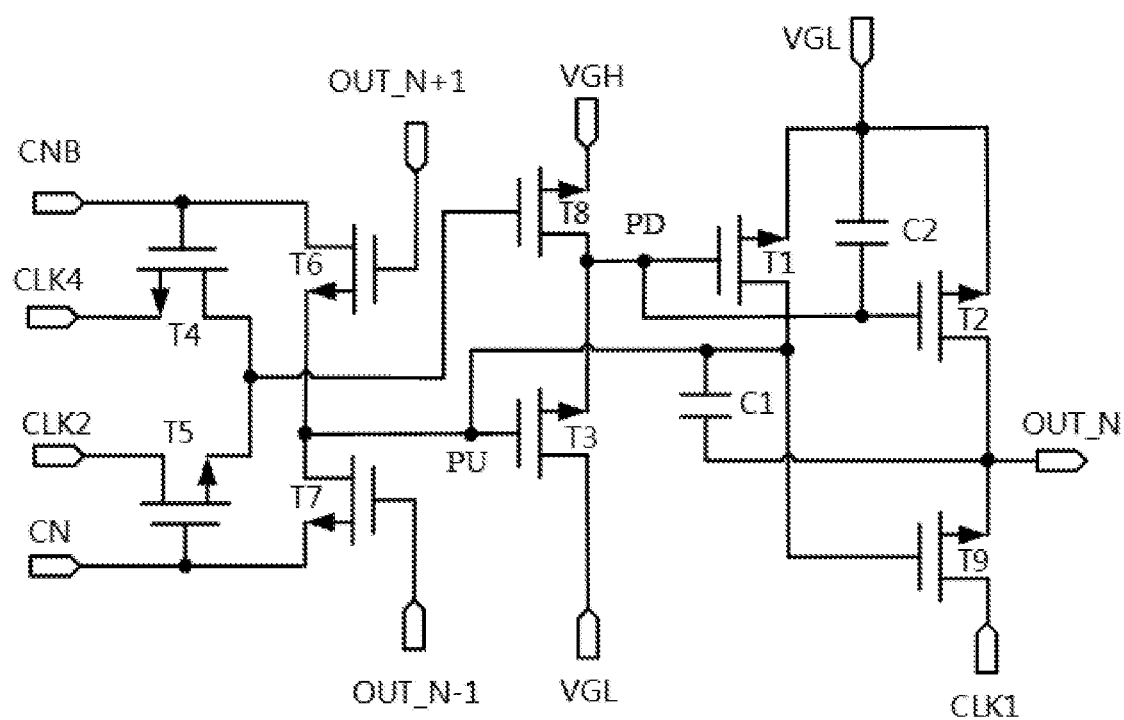
FIG. 7 illustrates a circuit diagram of a shift register unit according to the first embodiment of the present disclosure.

As illustrated in FIG. 7, in the first embodiment of the shift register unit of the present disclosure, the shift register unit can include an output circuit, a storage circuit, an output reset circuit, a pull-up node control circuit and a pull-down node control circuit.

In some such embodiments, the storage capacitor can include a first storage capacitor C1, wherein the first terminal of the first storage capacitor C1 can be connected to a pull-up node PU, and the second terminal of the first storage capacitor C1 can be connected to a n-level gate electrode driving signal output terminal OUT-N. Further, the pull-up node control circuit can include a first pull-up control transistor T7, a second pull-up control transistor T6, and a third pull-up control transistor T1.

Additionally, the gate electrode of the first pull-up control transistor T7 can be connected to a N−1 level gate electrode driving signal output terminal OUT-N−1, wherein the drain electrode of the first pull-up control transistor T7 can be connected to the pull-up node PU, and the source electrode of the first pull-up control transistor T7 can be connected to a forward scan control terminal CN.

As illustrated here, the gate electrode of the second pull-up control transistor T6 can be connected to a N+1 level gate electrode driving signal output terminal OUT-N+1, the drain electrode of the second pull-up control transistor T6 can be connected to a reverse scan control terminal CNB, and the source electrode of the second pull-up control transistor T6 can be connected to the pull-up node PU. Ultimately, the gate electrode of the third pull-up control transistor T1 can be connected to a pull-down node PD, the drain electrode of the third pull-up control transistor T1 can be connected to the pull-up node PU, and the second electrode of the third pull-up control transistor T1 can be connected to a low voltage terminal, wherein the low voltage terminal can be utilized to input a low voltage VGL.

In some additional embodiments, the pull-down node control circuit can include a first pull-down control transistor T5, a second pull-down control transistor T4, a third pull-down control transistor T8, and a fourth pull-down control transistor T3.

In some such embodiments, the gate electrode of the first pull-down control transistor T5 can be connected to the forward scan control terminal CN, the drain electrode of the first pull-down control transistor T5 can be connected to a second clock signal input terminal CLK2, and the source electrode of the first pull-down control transistor T5 can be connected to a pull-down control node PDCN.

Additionally, the gate electrode of the second pull-down control transistor T4 can be connected to the reverse scan control terminal CNB, the drain electrode of the second pull-down control transistor T4 can be connected to a fourth clock signal input terminal CLK4, and the source electrode of the second pull-down control transistor T4 can be connected to the pull-down control node PDCN.

Additionally, the gate electrode of the third pull-down control transistor T8 can be connected to the pull-down control node PDCN, the drain electrode of the third pull-down control transistor T8 can be connected to the pull-down node PD, and the source electrode of the third pull-down control transistor T8 can be connected to a high voltage terminal, wherein the high voltage terminal can be utilized to input a high voltage VGH.

Additionally, the gate electrode of the fourth pull-down control transistor T3 can be connected to the pull-up node PU, the drain electrode of the fourth pull-down control transistor T3 can be connected to the low voltage terminal, and the source electrode of the fourth pull-down control transistor T3 can be connected to the pull-down node PD.

In some additional embodiments, the output reset circuit can include an output reset transistor T2 and a second storage capacitor C2.

In some such embodiments, the gate electrode of the output reset transistor T2 can be connected to the pull-down node PD, the drain electrode of the output reset transistor T2 can be connected to the N-level gate electrode driving signal output terminal OUT-N, and the source electrode of the output reset transistor T2 can be connected to the low voltage terminal.

Additionally, the first terminal of the second storage capacitor C2 can be connected to the pull-down node PD, and the second terminal of the second storage capacitor C2 can be connected to the low voltage terminal.

In some embodiments, the output circuit can include an output transistor T9;

In some such embodiments, the gate electrode of the output transistor T9 can be connected to the pull-up node PU, the drain electrode of the output transistor T9 can be connected to the first clock signal input terminal CLK1, and the source electrode of the output transistor T9 can be connected to the N-level gate electrode driving signal output terminal OUT-N.

In the first embodiment of the shift register unit of the present disclosure illustrated in FIG. 7, all transistors can be n-type transistors, however, this arrangement is made by way of example only, and those having skill in the art will recognize alternative applications, components, and arrangements and as such no limitations are intended thereby.

In one embodiment of the shift register unit as contemplated by the inventive concepts of the present disclosure, the input clock signal input terminal can be the first clock signal input terminal CLK1, the forward scan clock signal input terminal can be the second clock signal input terminal CLK2, the reverse scan clock signal input terminal can be the fourth clock signal input terminal CLK4, the first voltage input terminal can be the low voltage terminal, and the second voltage terminal can be the high voltage terminal.

Figure 8:
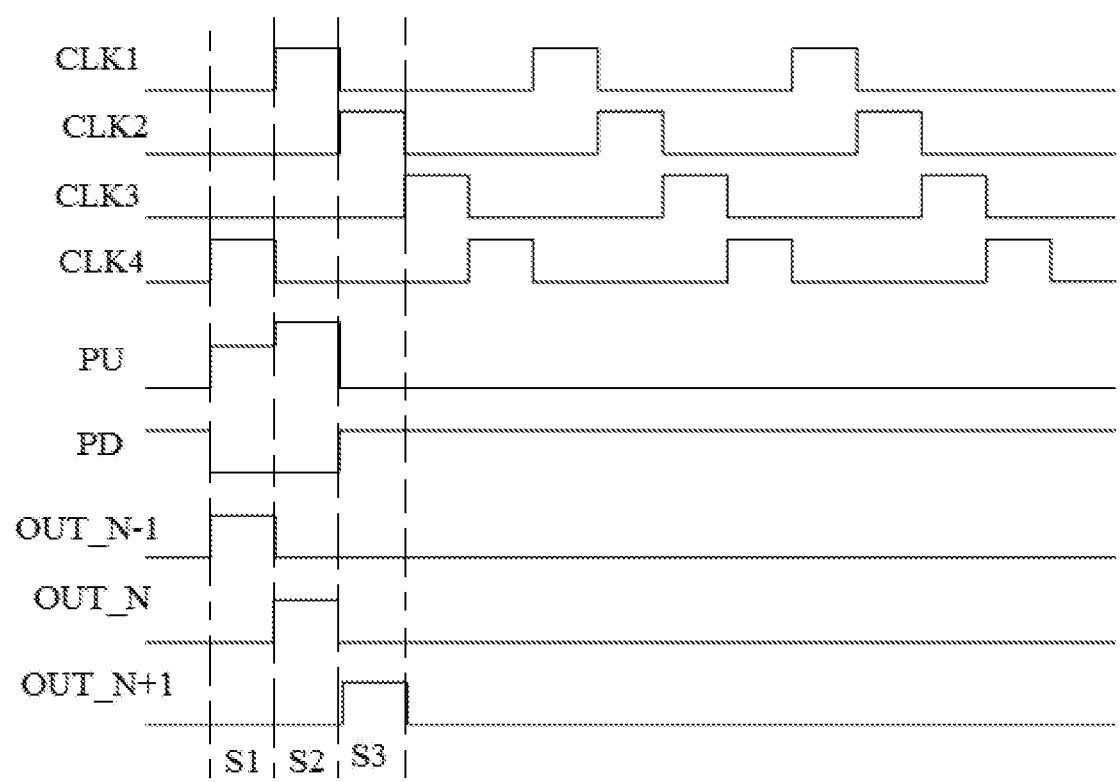
FIG. 8 illustrates a working sequence diagram of a shift register unit according to the first embodiment of the present disclosure during a forward scanning stage.

As illustrated in FIG. 8, CLK3 refers to the third clock signal input terminal.

In some such embodiments CLK1 can be utilized to input a first clock signal, CLK2 can be utilized to input a second clock signal, CLK3 can be utilized to input a third clock signal, and CLK4 can be utilized to input a fourth clock signal.

As illustrated in FIG. 8, the period of the first clock signal, the period of the second clock signal, the period of the third clock signal and the period of the fourth clock signal can be equal, wherein the period is T;

In some embodiments, the duty ratio of the first clock signal, the duty ratio of the second clock signal, the duty ratio of the third clock signal and the duty ratio of the fourth clock signal can all be ¼ T. In other words, the second clock signal can be delayed by T/4 compared with the first clock signal, the third clock signal can be delayed by T/4 compared with the second clock signal, the fourth clock signal can be delayed by T/4 compared with the third clock signal.

The shift register unit of the first embodiment of the present FIG. 7 can be a N-level Gate on Array (GOA) unit, wherein, N is a positive integer.

FIG. 8 then illustrates an exemplary time sequence diagram of the first embodiment of the shift register unit of the present disclosure during forward scanning stage. During forward scanning stage, CN can output high electric potential, CNB can output low electric potential.

As illustrated in FIG. 8, in the first embodiment of the shift register unit, is illustrated as operating in a forward scanning stage.

In this exemplary operation, during the input stage S1, CN can output high electric potential, OUT-N−1 can output high electric potential, T7 can be turned on, the electric potential of PU can be pulled up, C1 can be charged, T3 can be turned on, the electric potential of PD can be pulled down, T9 can be turned on, and at this time, CLK1 can input low electric potential, OUT_N can output a low electric potential;

During the gate electrode driving signal output stage S2, because of the bootstrap function of C1, the electric potential of PU can be increased continuously. In such a situation, T9 can still be turned on, CLK1 can input a high electric potential, and OUT_N can output a high electric potential.

During an exemplary reset stage S3, CLK2 can input high electric potential, T8 can be turned on, the electric potential of PD can be pulled up, T1 and T2 can both be turned on, such that the electric potential of PU can be pulled down and OUT_N can be controlled to output a low electric potential to charge C2.

During each other stage of the same frame after the reset stage, because the hold function of C2 and the influence of high electric potential inputted by CLK2, the electric potential of PD can be always at a high level, the electric potential of PU and the gate electrode driving signal outputted by OUT_N can be always in a pulled-down state, which, as a result, can effectively prevent noise.

Figure 9:
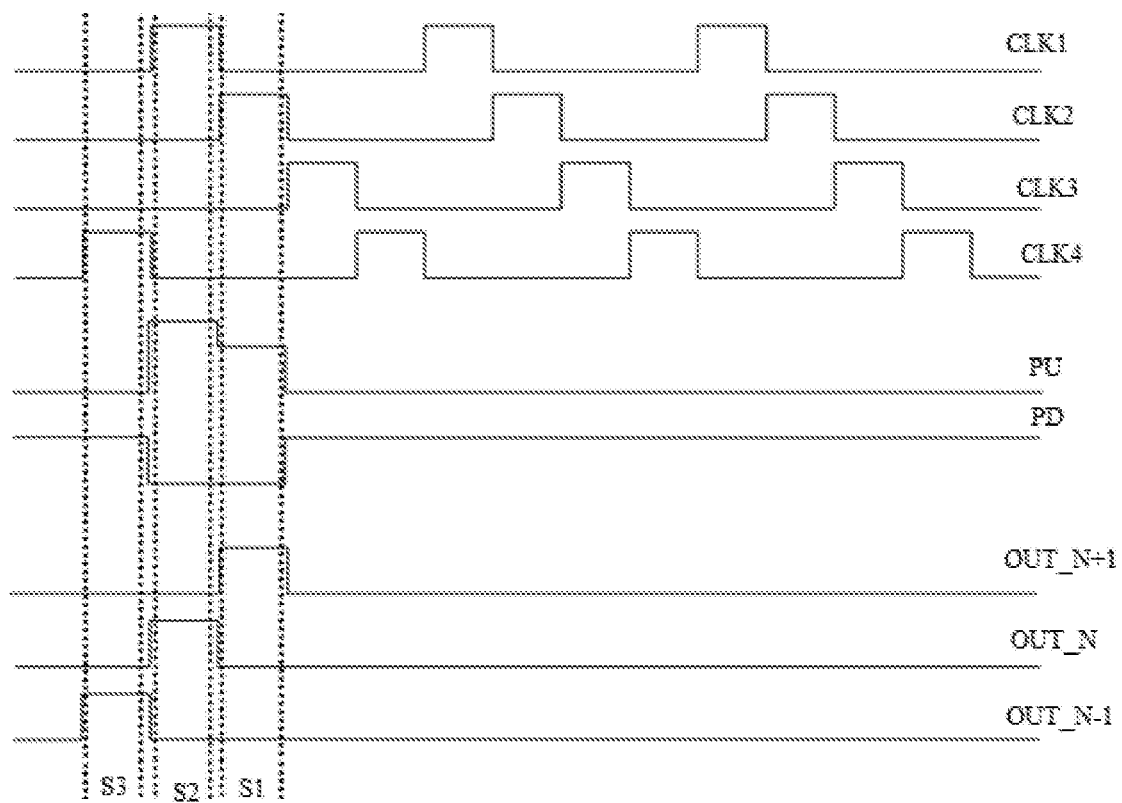
FIG. 9 illustrates a working sequence diagram of a shift register unit according to the first embodiment of the present disclosure during reverse scanning stage.

FIG. 9 illustrates a time sequence diagram of the shift register unit of the first embodiment of the present disclosure during reverse scanning stage. During reverse scanning stage, CN can output low electric potential, and CNB can output a high electric potential.

As illustrated in FIG. 9, CLK3 refers to a third clock signal input terminal, CLK1 can be utilized to input a first clock signal, CLK2 can be utilized to input a second clock signal, CLK3 can be utilized to input a third clock signal, and CLK4 can be utilized to input a fourth clock signal.

As illustrated in FIG. 9, the period of the first clock signal, the period of the second clock signal, the period of the third clock signal and the period of the fourth clock signal are equal, each having a period of T;

The duty ratio of the first clock signal, the duty ratio of the second clock signal, the duty ratio of the third clock signal and the duty ratio of the fourth clock signal can then all be ¼T.

In such an embodiment, the second clock signal can be delayed by T/4 compared with the first clock signal, the third clock signal can be delayed by T/4 compared with the second clock signal, and the fourth clock signal can be delayed by T/4 compared with the third clock signal.

As illustrated in FIG. 9, in the shift register unit is operating during reverse scanning stage according to the first embodiments of the present disclosure.

In such a situation, during the input statgeS1, OUT-N+1 can output a high electric potential, wherein T6 can be turned on. As such, the electric potential of PU can be pulled up to charge C1, wherein T3 can be turned on, and the electric potential of PD can be pulled down. Additionally, T9 can be turned on, and at this time CLK2 can input a low electric potential, wherein OUT_N can output a low electric potential.

In such a situation, during the gate electrode driving signal output state S2, because of the bootstrap function of C1, the electric potential of PU can be increased continuously, T9 can still be turned on, CLK1 can input a high electric potential, and OUT_N can output a high electric potential.

In such a situation, during the reset stage S3, CLK4 can input high electric potential, T8 can be turned on, such that the electric potential PD can be pulled up, T1 and T2 can both be turned on, the electric potential of PU can be pulled down, OUT_N can output a low electric potential to charge C2.

In such a situation, during each stage of the same frame after the reset stage S3, because of the bootstrap function of C2 and the influence of high electric potential inputted by CLK4, the electric potential of PD can be always at high level, the electric potential of PU and the gate electrode driving signal outputted by OUT-N can always be in a pulled-down state, as a result, noise can be effectively prevented.

Figure 10:
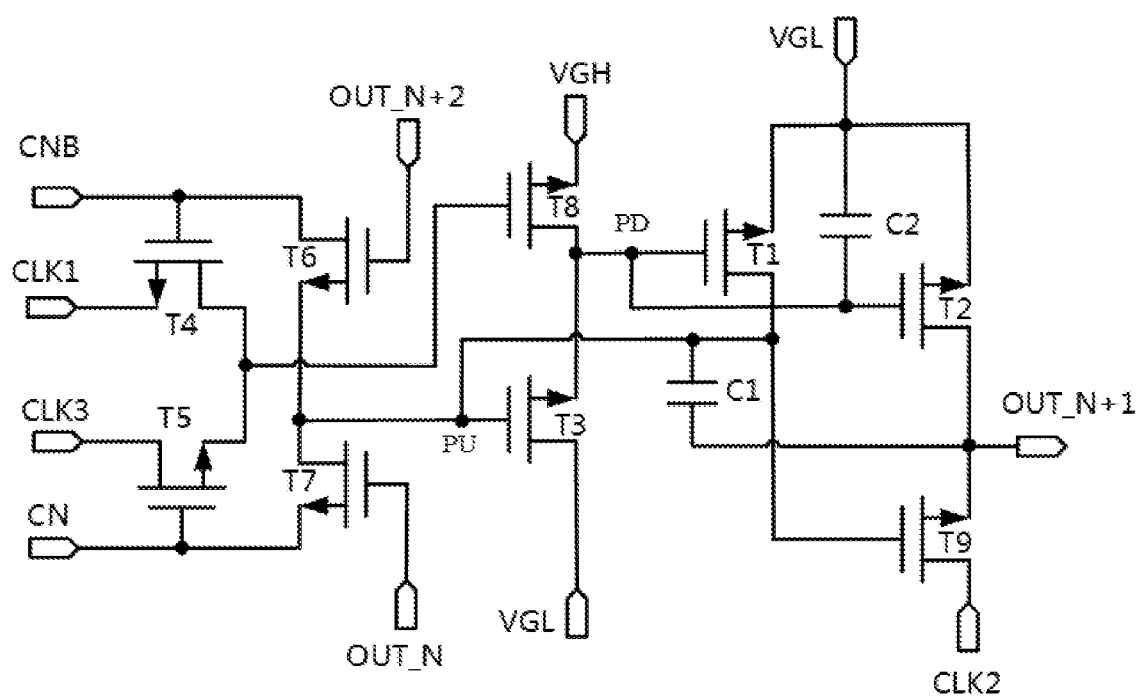
FIG. 10 illustrates a circuit diagram of a shift register unit according to the second embodiment of the present disclosure.

As illustrated in FIG. 10, the shift register unit of the second embodiment of the present disclosure can also include an output circuit, a storage circuit, an output reset circuit, a pull-up node control circuit, and a pull-down node control circuit;

As illustrated here, the storage circuit can include a first storage capacitor C1, wherein the first terminal of the first storage capacitor C1 can be connected to the pull-up node PU, and the second terminal of the first storage capacitor C1 can be connected to the N+1 level gate electrode driving output terminal OUT_N+1;

In some such embodiments, the pull-up node control circuit can include a first pull-up control transistor T7, a second pull-up control transistor T6, and a third pull-up control transistor T1.

In this embodiment, the gate electrode of the first pull-up control transistor T7 can be connected to the N-level gate electrode driving signal output terminal OUT_N, the drain electrode of the first pull-up control transistor T7 can be connected to the pull-up node PU, and the source electrode of the first pull-up control transistor T7 can be connected to the forward scan control terminal CN.

Further, The gate electrode of the second pull-up control transistor T6 can be connected to the N+2-level gate electrode driving signal output terminal OUT_N+2, the drain electrode of the second pull-up control transistor T6 can be connected to the reverse scan control terminal CNB, and the source electrode of the first pull-up control transistor T6 can be connected to the pull-up node PU.

Additionally, the gate electrode of the third pull-up control transistor T1 can be connected to the pull-down node PD, the drain electrode of the third pull-up control transistor T1 can be connected to the pull-up node PU, and the second electrode of the third pull-up control transistor T1 can be connected to the low voltage terminal, wherein the low voltage terminal can be utilized to input a low voltage VGL.

In some embodiments, as illustrated here, the pull-down node control circuit can include a first pull-down control transistor T5, a second pull-down control transistor T4, a third pull-down control transistor T8, and a fourth pull-down control transistor T3;

In this embodiment, the gate electrode of the first pull-down control transistor T5 can be connected to the forward scan control terminal CN, the drain electrode of the first pull-down control transistor T5 can be connected to the third clock signal input terminal CLK3, and the source electrode of the first pull-down control transistor T5 can be connected to the pull-down control node PDCN.

Additionally, the gate electrode of the second pull-down control transistor T4 can be connected to the reverse scan control terminal CNB, the drain electrode of the second pull-down control transistor T4 can be connected to the first clock signal input terminal CLK1, and the source electrode of the second pull-down control transistor T4 can be connected to the pull-down control node PDCN.

Further, the gate electrode of the third pull-down control transistor T8 can be connected to the pull-down control node PDCN, the drain electrode of the third pull-down control transistor T8 can be connected to the pull-down node PD, and the source electrode of the third pull-down control transistor T8 can be connected to the high voltage terminal, wherein the high voltage terminal can be utilized to input a high voltage VGH;

In some such embodiments, the gate electrode of the fourth pull-down control transistor T3 can be connected to the pull-up node PU, the drain electrode of the fourth pull-down control transistor T3 can be connected to the low voltage terminal, and the source electrode of the fourth pull-down control transistor T3 can be connected to the pull-down node PD.

As illustrated, the output reset circuit can include an output reset transistor T2 and a second storage capacitor C2.

In this embodiment, the gate electrode of the output reset transistor T2 can be connected to the pull-down node PD, the drain electrode of the output reset transistor T2 can be connected to the N+1 level gate electrode signal output terminal OUT_N+1, and the source electrode of the output reset transistor T2 can be connected to the low voltage terminal;

Further, the first terminal of the second storage capacitor C2 can be connected to the pull-down node PD, and the second terminal of the second storage capacitor C2 can be connected to the low voltage terminal.

In some embodiments contemplated herein the output circuit can include an output transistor T9, wherein the gate electrode of the output transistor T9 can be connected to the pull-up node PU, the drain electrode of the output transistor T9 can be connected to the second clock signal input terminal CLK2, and the source electrode of the output transistor T9 can be connected to the N+1 level gate electrode driving signal output terminal OUT_N+1.

In the shift register unit of the second embodiment of the present disclosure as illustrated in FIG. 10, all transistors can be n-type transistors, however, this arrangement is made by way of example only, and those having skill in the art will recognize alternative applications, components, and arrangements and as such no limitations are intended thereby.

In the shift register unit of the second embodiment of the present disclosure, the output clock signal input terminal can be the second clock signal input terminal CLK2, the forward scan clock signal input terminal can be the third clock signal input terminal CLK3, and the reverse scan clock signal input terminal can be the first clock signal input terminal CLK1, wherein the first voltage input terminal can be the low voltage terminal, and the second voltage input terminal can be the high voltage terminal.

Figure 11:
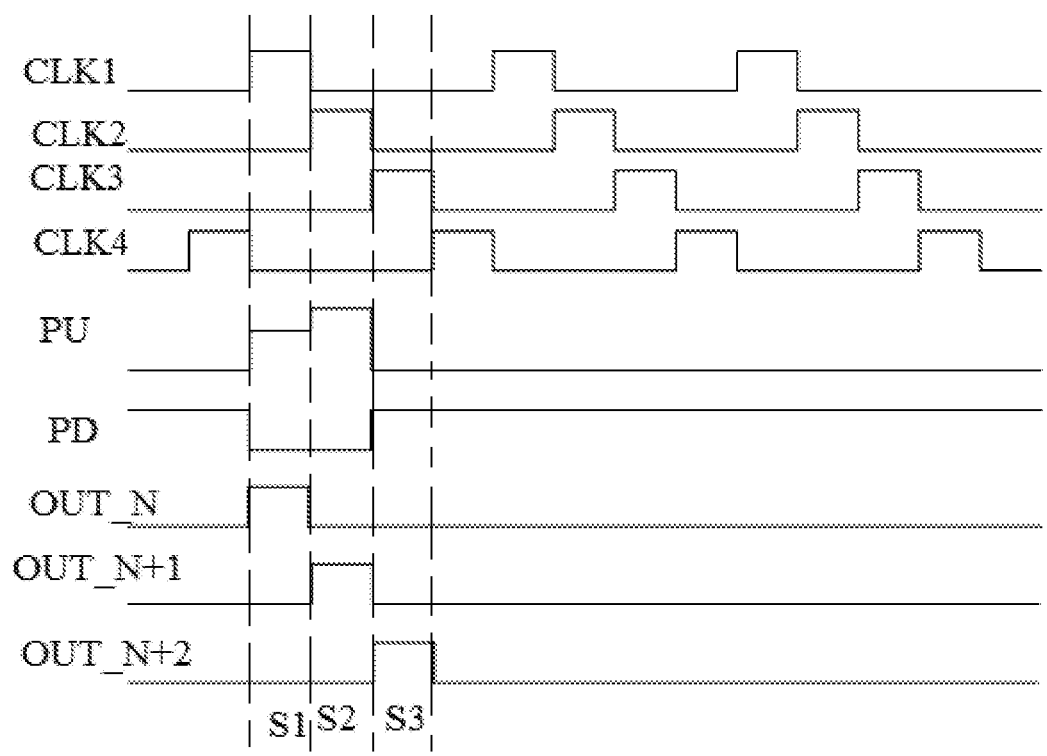
FIG. 11 illustrates a working sequence diagram of a shift register unit according to the second embodiment of the present disclosure during forward scanning stage.

As illustrated in FIG. 11, CLK4 refers to the fourth clock signal input terminal.

In this embodiment, CLK1 can be utilized to input a first clock signal, CLK2 can be utilized to input a second clock signal, CLK3 can be utilized to input a third clock signal, and CLK4 can be utilized to input a fourth clock signal.

As illustrated in FIG. 11, the period of the first clock signal, the period of the second clock signal, the period of the third clock signal and the period of the fourth clock signal are equal, wherein the period is T.

The duty ratio of the first clock signal, the duty ratio of the second clock signal, the duty ratio of the third clock signal and the duty ratio of the fourth clock signal can all be $\frac{1}{4}T$, wherein the second clock signal can be delayed by T/4 compared with the first clock signal, the third clock signal can be delayed by T/4 compared with the second clock signal, and the fourth clock signal can be delayed by T/4 compared with the third clock signal.

The second embodiment of the shift register, as illustrated in FIG. 10, can be a N+1 level GOA (Gate on Array) unit, wherein, N is a positive integer.

FIG. 11 is a time sequence diagram of the shift register unit of the second embodiment of the present disclosure during forward scanning stage, during forward scanning stage, CN can output a high electric potential, wherein CNB can output a low electric potential.

In particular, FIG. 11 illustrates the shift register unit of the second embodiment of the present disclosure during forward scanning stage. In this illustrated scenario, during the input stage S1, CN can output a high electric potential, OUT_N can output a high electric potential, T7 can be turned on, the electric potential of PU can be pulled up to charge C1, T3 can be turned on, the electric potential of PD can be pulled down, T9 can be turned on, and at this time CLK2 can input a low electric potential, wherein OUT_N++1 can output allow electric potential.

During the gate electrode driving signal output stage S2, because of the bootstrap function of C1, the electric potential of PU can be increased consciously, T9 can still be turned on, CLK2 can input a high electric potential, OUT_N+1 can output a high electric potential.

Also, during the reset stage S3, CLK3 can input a high electric potential, T8 can be turned on, the electric potential of PD can be pulled up, and T1 and T2 can both be turned on, such that the electric potential of PU can be pulled down and OUT_N+1 can be controlled to output a low electric potential to charge C2.

Finally, during each stage of the same frame after the reset stage S3, because of the bootstrap function of C2 and the influence of the high electric potential inputted by CLK3, the electric potential of PD can always be at a high level, the electric potential of PU and the gate electrode driving signal outputted by OUT_N+1 can always be in a pulled-down state, as a result, noise can be prevented.

Figure 12:
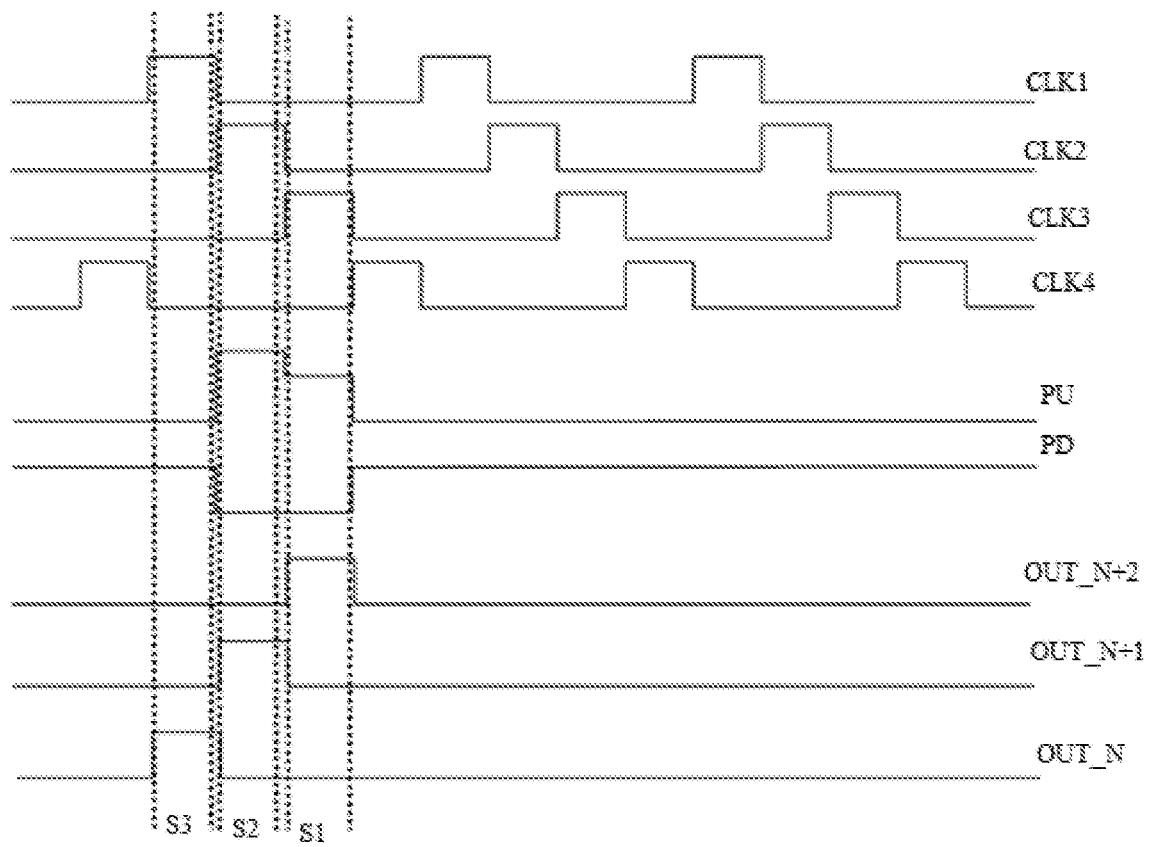
FIG. 12 illustrates a working sequence diagram of a shift register unit according to the second embodiment of the present disclosure during reverse scanning stage.

FIG. 12 illustrates a time sequence diagram of the shift register unit of the second embodiment of the present disclosure during reverse scanning stage, during reverse scanning stage, CN can output a low electric potential, wherein CNB can output high electric potential.

As particularly illustrated in FIG. 12, CLK3 refers to the third clock signal input terminal, wherein CLK1 can be utilized to input a first clock signal, CLK2 can be utilized to input a second clock signal, CLK3 can be utilized to input a third clock signal, and CLK4 can be utilized to input a fourth clock signal.

As illustrated in FIG. 12, the period of the first clock signal, the period of the second clock signal, the period of the third clock signal, and the period of the fourth clock signal are equal, the period is T, wherein the duty ratio of the first clock signal, the duty ratio of the second clock signal, the duty ratio of the third clock signal and the duty ratio of the fourth clock signal are all ¼ T. In this embodiment, the second clock signal can be delayed by T/4 compared with the first clock signal, the third clock signal can be delayed by T/4 compared with the second clock signal, the fourth clock signal can be delayed by T/4 compared with the third clock signal.

As also illustrated in FIG. 12, the shift register unit of the second embodiment of the present disclosure is particularly illustrated during a reverse scanning stage.

In such an embodiment, during the input stage S1, OUT_N+2 can output a high electric potential, T6 can be turned on, the electric potential of PU can be pulled up to charge C1, T3 can be turned on, the electric potential of PD can be pulled down, T9 can be turned on, and at this time CLK2 can input a low electric potential, while OUT_N+1 can then output a low electric potential.

During the gate driving signal output stage S2, because of the bootstrap function of C1, the electric potential of PU can be increased continuously, T9 can still be turned on, while CLK2 can input a high electric potential, and OUT_N+1 can then output a high electric potential.

During the reset stage S3, CLK1 can input high electric potential, T8 can be turned on, such that the electric potential of PD can be pulled up, T1 and T2 can be both turned on, the electric potential of PU can be pulled down, and OUT_N+1 can output low electric potential to charge C2.

During each stage of the same frame after the reset stage S3, because of the bootstrap function of C2 and the influence of high electric potential inputted by CLK1, the electric potential of PD can be always at a high level, the electric potential of PU and the gate electrode driving signal outputted by OUT_N+1 can always be in a pulled-down state, which as a result, allows for noise to be effectively prevented.

Figure 13:
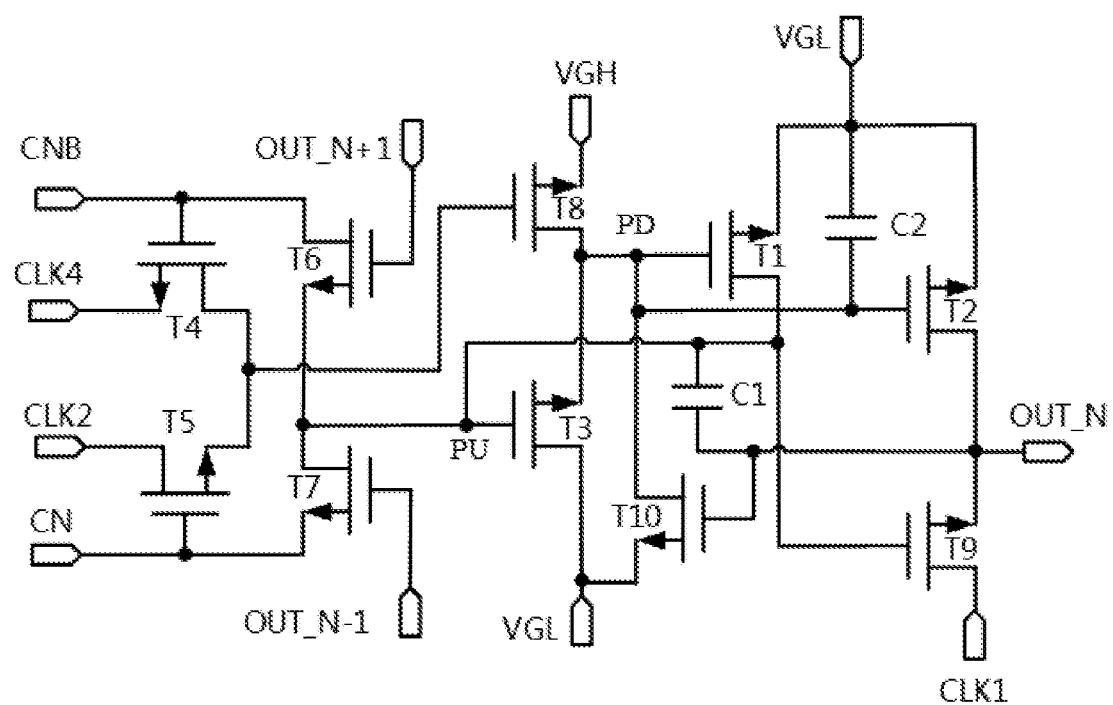
FIG. 13 illustrates a circuit diagram of a shift register unit according to the third embodiment of the present disclosure.

As illustrated in FIG. 13, the shift register unit of a third embodiment of the present disclosure, as shown herein, which can include an output circuit, a storage circuit, a pull-down node reset circuit, an output reset circuit, a pull-up node control circuit, and a pull-down node control circuit, wherein the storage circuit can include a first storage capacitor C1.

In this embodiment, the first terminal of the first storage capacitor C1 can be connected to the pull-up node PU, the second terminal of the first storage capacitor C1 can be connected to the N-level gate electrode driving signal output terminal OUT_N.

Further, the pull-down node reset circuit can include a pull-down node reset transistor T10, wherein the gate electrode of the pull-down node reset transistor T10 can be connected to the N-level gate electrode driving signal output terminal OUT_N, the drain electrode of the pull-down node reset transistor T10 can be connected to the pull-down node PD, the source electrode of the pull-down node reset transistor T10 can be connected to the low voltage terminal, and the low voltage terminal can be utilized to input a low voltage VGL.

Additionally, the pull-up node control circuit can include a first pull-up control transistor T7, a second pull-up control transistor T6, and a third pull-up control transistor T1.

In this embodiment, the gate electrode of the first pull-up control transistor T7 can be connected to the N−1 level gate electrode driving signal output terminal OUT_N−1, the drain electrode of the first pull-up control transistor T7 can be connected to the pull-up node PU, and the source electrode of the first pull-up control transistor T7 can be connected to the forward scan control terminal CN.

Additionally, this embodiment includes an arrangement in which, the gate electrode of the second pull-up control transistor T6 can be connected to the N+1 level gate electrode driving signal output terminal OUT_N+1, the drain electrode of the second pull-up control transistor T6 can be connected to the reverse scan control terminal CNB, and the source electrode of the second pull-up control transistor T6 can be connected to the pull-up node PU.

Further, the gate electrode of the third pull-up control transistor T1 can be connected to the pull-down node PD, the drain electrode of the third pull-up control transistor T1 can be connected to the pull-up node PU, the source electrode of the third pull-up control transistor T1 can be connected to the low voltage terminal, and the low voltage terminal can be utilized to input a low voltage VGL.

Additionally, in this embodiment, the pull-down node control circuit can include a first pull-down control transistor T5, a second pull-down control transistor T4, a third pull-down control transistor T8, and a fourth pull-down control transistor T3.

In this arrangement, the gate electrode of the first pull-down control transistor T5 can be connected to the forward scan control terminal CN, the drain electrode of the first pull-down control transistor T5 can be connected to the second clock signal input terminal CLK2, and the source electrode of the first pull-down control transistor T5 can be connected to the pull-down control node PDCN.

Also, in this arrangement, the gate electrode of the second pull-down control transistor T4 can be connected to the reverse scan control terminal CNB, the drain electrode of the second pull-down control transistor T4 can be connected to the fourth clock signal input terminal CLK4, and the source electrode of the second pull-down control transistor T4 can be connected to the pull-down control node PDCN.

Also, in this arrangement, the gate electrode of the third pull-down control transistor T8 can be connected to the pull-down control node PDCN, the drain electrode of the third pull-down control transistor T8 can be connected to the pull-down node PD, and the source electrode of the third pull-down control transistor T8 can be connected to the high voltage terminal; the high voltage terminal can be utilized to input a high voltage VGH.

Also, in this arrangement, the gate electrode of the fourth pull-down control transistor T3 can be connected to the pull-up node PU, the drain electrode of the fourth pull-down control transistor T3 can be connected to the low voltage terminal, and the source electrode of the fourth pull-down control transistor T3 can be connected to the pull-down node PD.

Also, in this embodiment, the reset output circuit can include a reset transistor T2 and a second storage capacitor C2, The gate electrode of the output reset transistor T2 can be connected to the pull-down node PD, the drain electrode of the output reset transistor T2 can be connected to the N-level gate electrode driving signal output terminal OUT_N, and the source electrode of the reset transistor T2 can be connected to the low voltage terminal;

Also, in this arrangement, the first terminal of the second storage capacitor C2 can be connected to the pull-down node PD, and the second terminal of the second storage capacitor C2 can be connected to the low voltage terminal the output circuit can include an output transistor T9.

In this arrangement, the gate electrode of the output transistor T9 can be connected to the pull-up node PU, the drain electrode of the output transistor T9 can be connected to the first clock signal input terminal CLK1, and the source electrode of the output transistor T9 can be connected to the N-level gate electrode driving signal output terminal OUT_N.

In the shift register unit of the third embodiment of the present disclosure, all transistors can be n-type transistors, however, this arrangement is made by way of example only, and those having skill in the art will recognize alternative applications, components, and arrangements and as such no limitations are intended thereby.

In the shift register unit of this third embodiment of the present disclosure, the output clock signal input terminal can be the first clock signal input terminal, the forward scan clock signal input terminal can be the second clock signal input terminal CLK2, the reverse scan clock signal input terminal can be the fourth clock signal input terminal CLK4.

In such arrangements, the first voltage input terminal can be the low voltage terminal, and the second voltage input terminal can be the high voltage terminal.

Figure 14:
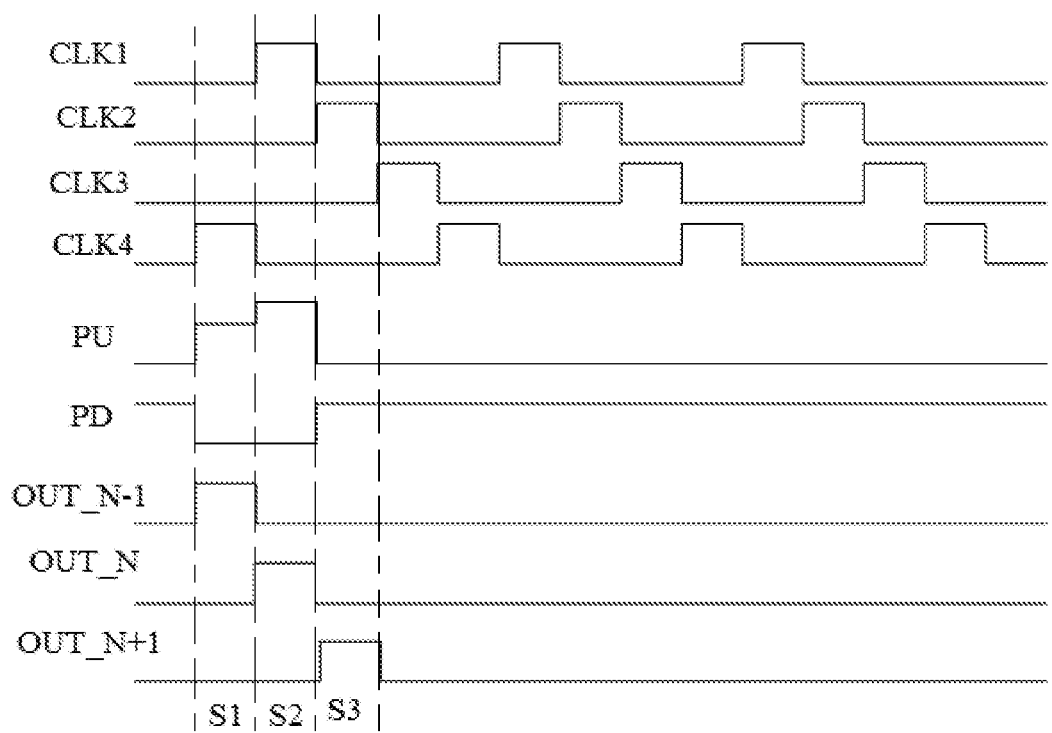
FIG. 14 illustrates a working sequence diagram of a shift register unit according to the third embodiment of the present disclosure during forward scanning stage.

As illustrated in FIG. 14, CLK3 refers to the third clock signal input terminal.

In this arrangement, CLK1 can be utilized to input a first clock signal, CLK2 can be utilized to input a second clock signal, CLK3 can be utilized to input a third clock signal, and CLK4 can be utilized to input a fourth clock signal.

As illustrated in FIG. 14, the period of the first clock signal, the period of the second clock signal, the period of the third clock signal, and the period of the fourth clock signal are equal, the period is T, wherein the duty ratio of the first clock signal, the duty ratio of the second clock signal, the duty ratio of the third clock signal and the duty ratio of the fourth clock signal are all ¼T.

In this arrangement, the second clock signal can be delayed by T/4 compared with the first clock signal, the third clock signal can be delayed by T/4 compared with the second clock signal, the fourth clock signal can be delayed by T/4 compared with the third clock signal.

The shift register unit of the third embodiment of the present disclosure as illustrated in FIG. 13 can be a N-level GOA (Gate on Array) unit, wherein, N is a positive integer.

FIG. 14 illustrates a time sequence diagram of the shift register unit of the third embodiment of the present disclosure during forward scanning stage, during forward scanning stage, CN can output a high electric potential, CNB can output allow electric potential.

As illustrated in FIG. 14, the shift register unit of the third embodiment of the present disclosure, is particularly illustrated operating during forward scanning stage.

In this arrangement, during the input stage S1, CN can output a high electric potential, OUT_N−1 can output a high electric potential, T7 can be turned on, the electric potential of PU can be pulled up to charge C1, T3 can be turned on, the electric potential of PD can be pulled down, T9 can be turned on, and at this time CLK1 can input a low electric potential, and OUT_N can output a low electric potential.

During the gate electrode driving signal output stage S2, because of the bootstrap function of C1, the electric potential of PU can be allowed to increase continuously, T9 can still be turned on, CLK1 can input a high electric potential, OUT_N can output high electric potential, T10 can be turned on, which allows for the electric potential of PD to be pulled down.

During the reset stage S3, CLK2 can input high electric potential, T8 can be turned on, the electric potential of PD can be pulled up, T1 and T2 can both be turned on, such that the electric potential of PU can be pulled down, and OUT_N can be controlled to output a low electric potential to charge C2.

During each stage of the same frame after the reset stage S3, because of the hold function of C2 and the influence of the high electric potential inputted by CLK2, the electric potential of PD can be always at a high level, the electric potential of PU and the gate electrode driving signal outputted by OUT_N can always be in a pulled-down state, which can then allow noise to be effectively prevented.

Figure 15:
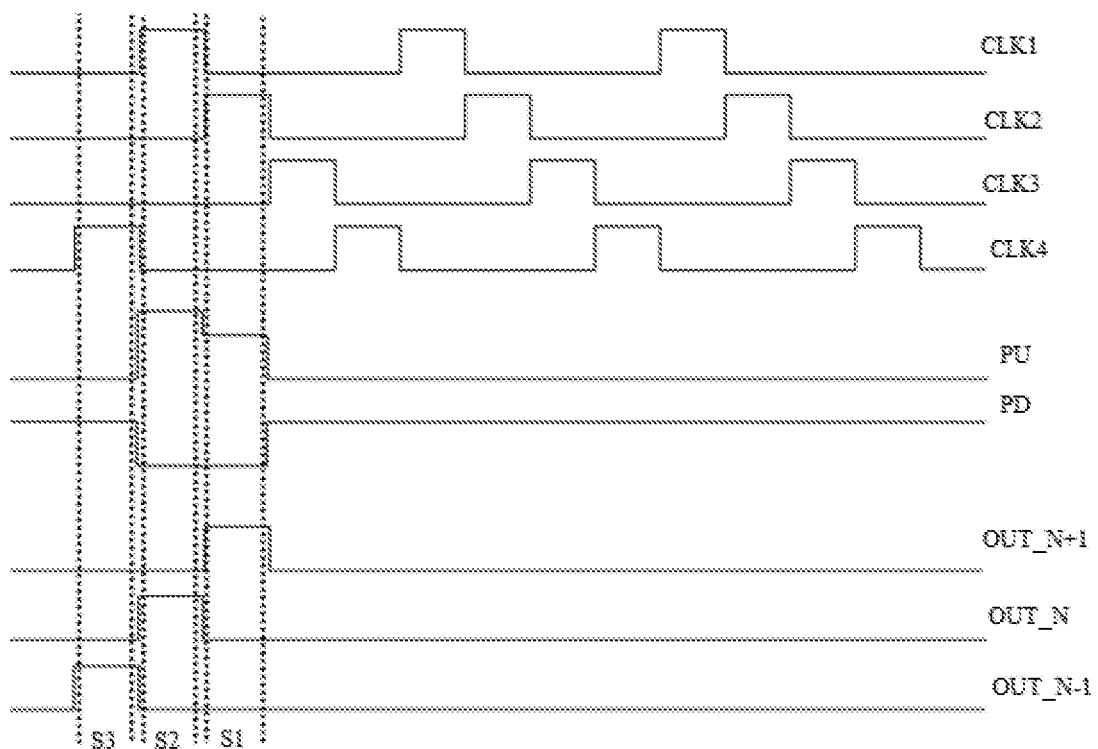
FIG. 15 illustrates a working sequence diagram of a shift register unit according to the third embodiment of the present disclosure during reverse scanning stage.

FIG. 15 is a time sequence diagram of the shift register unit of the third embodiment of the present disclosure during reverse scanning stage, during said reverse scanning stage, CN can output a low electric potential, and CNB can output high electric potential.

As illustrated in FIG. 15, CLK3 refers to the third clock signal input terminal, CLK1 can be utilized to input a first clock signal, CLK2 can be utilized to input a second clock signal, CLK3 can be utilized to input a third clock signal, and CLK4 can be utilized to input a fourth clock signal.

As illustrated in FIG. 15, the period of the first clock signal, the period of the second clock signal, the period of the third clock signal and the period of the fourth clock signal are equal, the period is T, the duty ratio of the first clock signal, the duty ratio of the second clock signal, the duty ratio of the third clock signal and the duty ratio of the fourth clock signal are all ¼T. As such, the second clock signal can be delayed by T/4 compared with the first clock signal, the third clock signal can be delayed by T/4 compared with the second clock signal, the fourth clock signal can be delayed by T/4 compared with the third clock signal.

As illustrated in FIG. 15, the shift register unit of the third embodiment of the present disclosure is illustrated during a reverse scanning stage, during the input stage S1, OUT_N+1 can output a high electric potential, T6 can be turned on, the electric potential of PU can be pulled up to charge C1, T3 can be turned on, the electric potential of PD can be pulled down, and T9 can be turned on; at this time CLK1 can input a low electric potential, and OUT_N can output low electric potential.

Alternatively, during the gate driving signal output stage S2, because of the bootstrap function of C1, the electric potential of PU can be increased continuously, T9 can be still turned on, CLK1 can input high electric potential, OUT_N can output high electric potential, and T10 can be turned on, such that the electric potential of PD can be pulled down.

In contrast, during the reset stage S3, CLK4 can input a high electric potential, and T8 can be turned on, such that the electric potential of PD can be pulled up, T1 and T2 can be both turned on, the electric potential of PU can be pulled down, and thus OUT_N can output a low electric potential to charge C2.

During each stage of the same frame after the reset stage S3, because of the hold function of C2 and the influence of high electric potential inputted by CLK4, the electric potential of PD can always be at a high level, the electric potential of PU and the gate electrode driving signal outputted by OUT_N can always be in a pulled-down state, which as a result, allows for noise to be effectively prevented.

Figure 16:
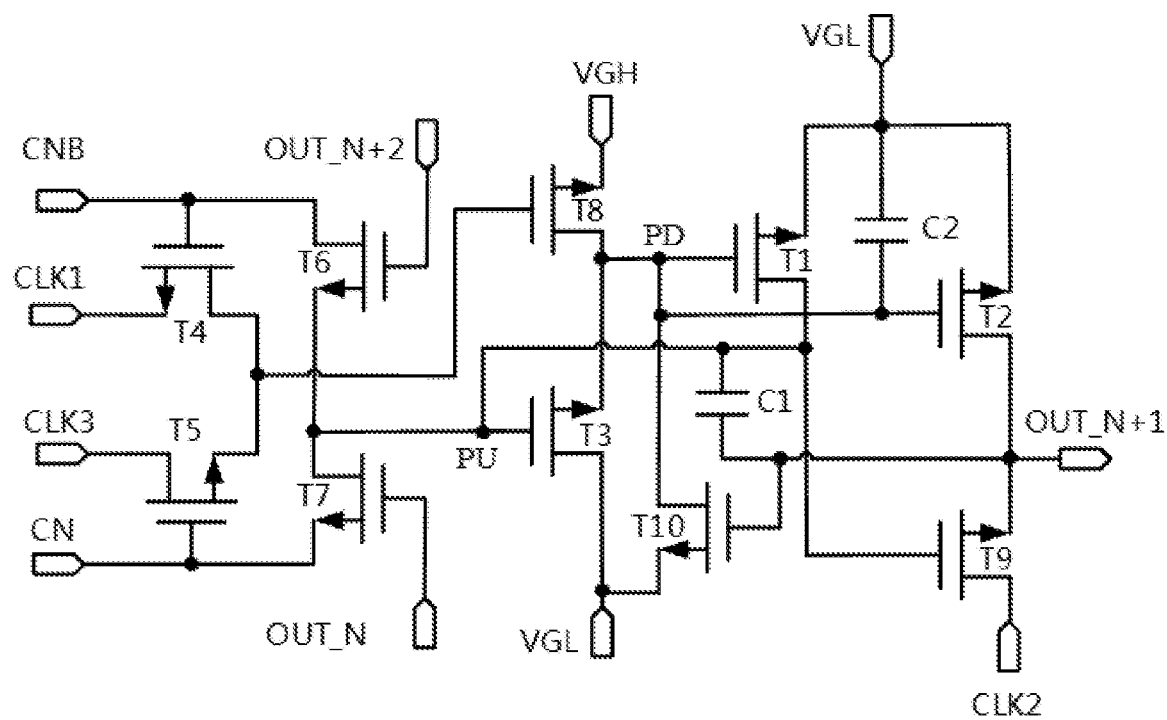
FIG. 16 illustrates a circuit diagram of a shift register unit according to the fourth embodiment of the present disclosure.

FIG. 16 particularly illustrates a shift register unit of a fourth embodiment of the present disclosure which can include an output circuit 11, a storage circuit 12, a pull-down node reset circuit 13, a reset output circuit 14, a pull-up node control circuit 15, and a pull-down node control circuit 16, the storage circuit can include a first storage capacitor C1.

In this embodiment, the first terminal of the first storage capacitor C1 can be connected to the pull-up node PU, the second terminal of the first storage capacitor C1 can be connected to the N+1 level gate electrode driving signal output terminal OUT_N+1;

In some such embodiments, the pull-down node reset circuit 13 can include a pull-down node reset transistor T10.

In some such embodiments, the gate electrode of T10 can be connected to the N+1 level gate electrode driving signal output terminal OUT_N+1, the drain electrode of T10 can be connected to the pull-down node PD, and the source electrode of T10 can be connected to the low voltage terminal, the low voltage terminal can be utilized to input a low voltage VGL;

In some such embodiments, the pull-up node control circuit 15 can include a first pull-up control transistor T7, a second pull-up control transistor T6, and a third pull-up control transistor T1.

In some such embodiments, the gate electrode of the first pull-up control transistor T7 can be connected to the N-level gate electrode driving signal output terminal OUT_N, the drain electrode of the first pull-up control transistor T7 can be connected to the pull-up node PU, and the source electrode of the first pull-up control transistor T7 can be connected to the forward scan control terminal CN.

In some such embodiments, the gate electrode of the second pull-up control transistor T6 can be connected to the N+2 level gate electrode driving signal output terminal OUT_N+2, the drain electrode of the second pull-up control transistor T6 can be connected to the reverse scan control terminal CNB, and the source electrode of the second pull-up control transistor T6 can be connected to the pull-up node PU.

In some such embodiments, the gate electrode of the third pull-up control transistor T1 can be connected to the pull-down node PD, the drain electrode of the third pull-up control transistor T1 can be connected to the pull-up node PU, and the second electrode of the third pull-up control transistor T1 can be connected to the low voltage terminal, the low voltage terminal can be utilized to input a low voltage VGL.

In some such embodiments, the pull-down node control circuit 16 can include a first pull-down control transistor T5, a second pull-down control transistor T4, a third pull-down control transistor T8 and a fourth pull-down control transistor T3.

In some such embodiments, the gate electrode of the first pull-down control transistor T5 can be connected to the forward scan control terminal CN, the drain electrode of the first pull-down control transistor T5 can be connected to the third clock signal input terminal CLK3, and the source electrode of the first pull-down control transistor T5 can be connected to the pull-down control node PDCN.

In some such embodiments, the gate electrode of the second pull-down control transistor T4 can be connected to the reverse scan control terminal CNB, the drain electrode of the second pull-down control transistor T4 can be connected to the first clock signal input terminal CLK1, and the source electrode of the second pull-down control transistor T4 can be connected to the pull-down control node PDCN.

In some such embodiments, the gate electrode of the third pull-down control transistor T8 can be connected to the pull-down control node PDCN, the drain electrode of the third pull-down control transistor T8 can be connected to the pull-down node PD, and the source electrode of the third pull-down control transistor T8 can be connected to the high voltage terminal, the high voltage terminal can be utilized to input a high voltage VGH.

In some such embodiments, the gate electrode of the fourth pull-down control transistor T3 can be connected to the pull-up node PU, the drain electrode of the fourth pull-down control transistor T3 can be connected to the low voltage terminal, and the source electrode of the fourth pull-down control transistor T3 can be connected to the pull-down node PD.

In some such embodiments, the output reset circuit 14 can include an output reset transistor T2 and a second storage capacitor C2.

In some such embodiments, the gate electrode of the output reset transistor T2 can be connected to the pull-down node PD, the drain electrode of the output reset transistor T2 can be connected to the N+1 level gate electrode driving signal output terminal OUT_N+1, and the source electrode of the output reset transistor T2 can be connected to the low voltage terminal.

In some such embodiments, the first terminal of the second storage capacitor C2 can be connected to the pull-down node PD, and the second terminal of the second storage capacitor C2 can be connected to the low voltage terminal.

In some such embodiments, the output circuit 11 can include an output transistor T9m the gate electrode of the output transistor T9 can be connected to the pull-up node PU, the drain electrode of the output transistor T9 can be connected to the second clock signal input terminal CLK2, and the source electrode of the output transistor T9 can be connected to the N+1 level gate electrode driving signal output terminal OUT_N+1.

In the shift register unit of the fourth embodiment of the present disclosure as illustrated in FIG. 16, all transistors can be n-type transistors, however, this arrangement is made by way of example only, and those having skill in the art will recognize alternative applications, components, and arrangements and as such no limitations are intended thereby.

In some such embodiments, such as in the shift register unit of the fourth embodiment of the present disclosure, the output clock signal input terminal can be the second clock signal input terminal CLK2, the forward scan clock signal input terminal can be the third clock signal input terminal CLK3, the reverse scan clock signal input terminal can be the first clock signal input terminal CLK1, and the first voltage input terminal can be the low voltage terminal, the second voltage input terminal can be the high voltage terminal.

Figure 17:
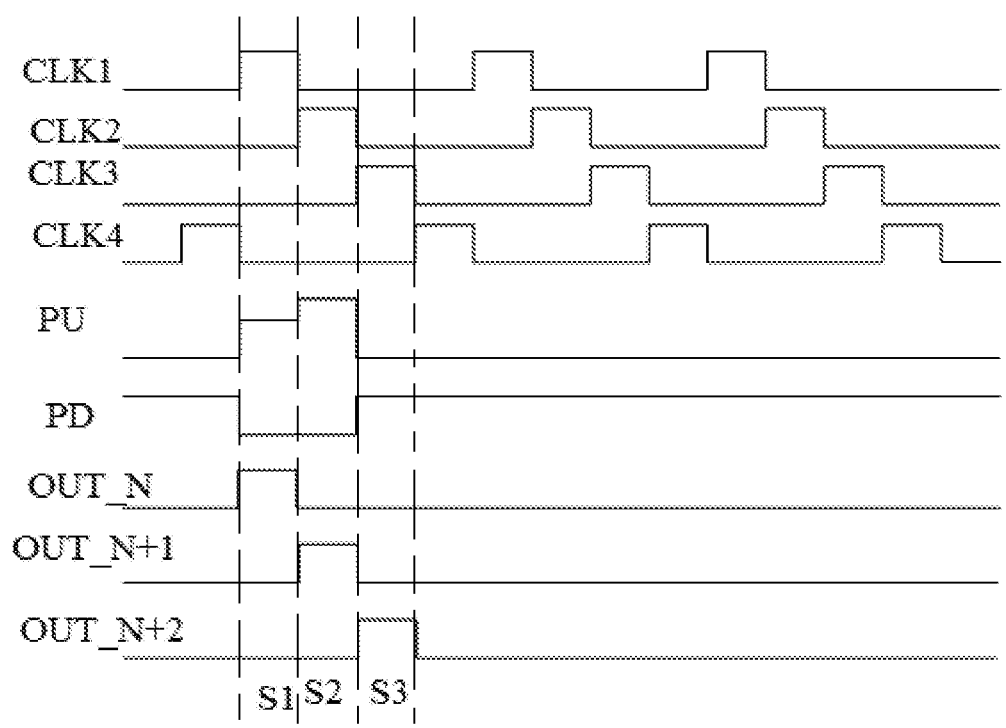
FIG. 17 illustrates a working sequence diagram of a shift register unit according to the fourth embodiment of the present disclosure during forward scanning stage.

As illustrated in FIG. 17, CLK4 refers to the fourth clock signal input terminal.

In some such embodiments, CLK1 can be utilized to input a first clock signal, CLK2 can be utilized to input a second clock signal, CLK3 can be utilized to input a third clock signal, and CLK4 can be utilized to input a fourth clock signal.

As illustrated in FIG. 17, the period of the first clock signal, the period of the second clock signal, the period of the third clock signal, and the period of the fourth clock signal are equal, the period can be T, the duty ratio of the first clock signal, the duty ratio of the second clock signal, the duty ratio of the third clock signal and the duty ratio of the fourth clock signal are all ¼T. In some such embodiments, the second clock signal can be delayed by T/4 compared with the first clock signal, the third clock signal can be delayed by T/4 compared with the second clock signal, the fourth clock signal can be delayed by T/4 compared with the third clock signal.

The shift register unit of the fourth embodiment of the present disclosure as illustrated in FIG. 16 can be a N+1 level GOA (Gate on Array) unit, wherein, N is a positive integer.

FIG. 7 is a time sequence diagram of the shift register unit of the fourth embodiment of the present disclosure during forward scanning stage, as employed during a forward scanning stage, CN can output a high electric potential, and CNB can output a low electric potential.

As illustrated in FIG. 14, the shift register unit of the fourth embodiment of the present disclosure is shown while operating during forward scanning stage.

In some such embodiments, during the input stage S1, CN can output a high electric potential, OUT_N can output a high electric potential, T7 can be turned on, the electric potential of PU can be pulled up to charge C1, T3 can be turned on, the electric potential of PD can be pulled down, T9 can be turned on, and at this time CLK2 can input low electric potential, OUT_N+1 can output low electric potential;

In some such embodiments, during the gate electrode driving signal output stage S2, because of the bootstrap function of C1, the electric potential of PU can be increased continuously, T9 can still be turned on, CLK2 can input high electric potential; OUT_N+1 can output high electric potential, and T10 can be turned on, such that the electric potential of PD can be pulled down.

During the reset stage S3, CLK3 can input a high electric potential, T8 can be turned on, the electric potential of PD can be pulled up, T1 and T2 can both be turned on, such that the electric potential of PU can be pulled down, and OUT_N+1 can be controlled to output low electric potential to charge C2.

During each stage of the same frame after the reset stage S3, because of the hold function of C2 and the influence of high electric potential inputted by CLK3, the electric potential of PD can be always at a high level, the electric potential of PU and the gate electrode driving signal outputted by OUT_N+1 can always be in a pulled-down state, as a result, noise can be effectively prevented.

Figure 18:
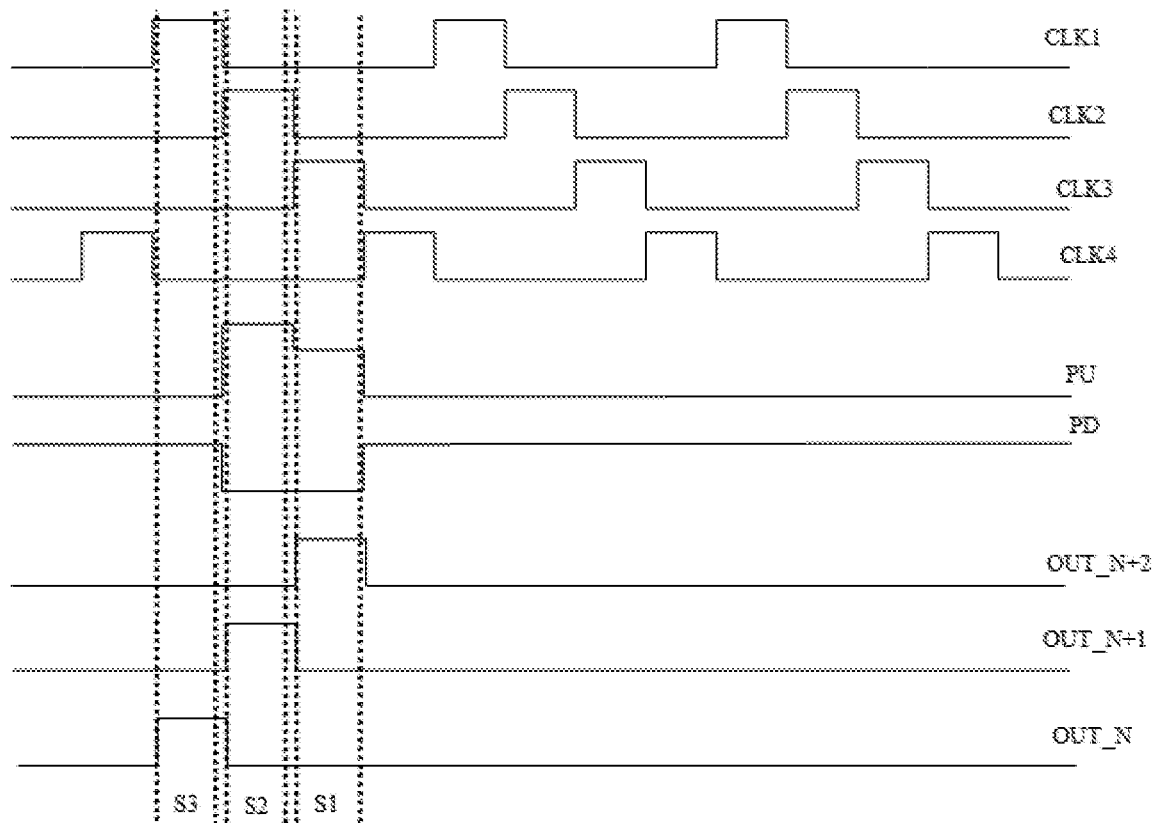
FIG. 18 illustrates a working sequence diagram of a shift register unit according to the fourth embodiment of the present disclosure during reverse scanning stage.

FIG. 18 is a time sequence diagram of the shift register unit of the fourth embodiment of the present disclosure during reverse scanning stage, during reverse scanning stage, CN can output low electric potential, and CNB can output high electric potential.

As illustrated in FIG. 18, CLK3 refers to the third clock signal input terminal.

CLK1 can be utilized to input a first clock signal, CLK2 can be utilized to input a second clock signal, CLK3 can be utilized to input a third clock signal, CLK4 can be utilized to input a fourth clock signal.

As illustrated in FIG. 18, the period of the first clock signal, the period of the second clock signal, the period of the third clock signal and the period of the fourth clock signal are equal, the period is T, the duty ratio of the first clock signal, the duty ratio of the second clock signal, the duty ratio of the third clock signal and the duty ratio of the fourth clock signal are all ¼T, and the second clock signal can be delayed by T/4 compared with the first clock signal, the third clock signal can be delayed by T/4 compared with the second clock signal, the fourth clock signal can be delayed by T/4 compared with the third clock signal.

As illustrated in FIG. 18, the shift register unit of the fourth embodiments of the present disclosure is being illustrated here during reverse scanning stage.

During the input stage S1, OUT_N+2 can output a high electric potential, T6 can be turned on, the electric potential of PU can be pulled up to charge C1, T3 can be turned on, the electric potential of PD can be pulled down, T9 can be turned on, and at this time CLK2 can input low electric potential, OUT_N+1 can output low electric potential;

During the gate driving signal output stage S2, because of the bootstrap function of C1, the electric potential of PU can be increased continuously, T9 can still be turned on, and CLK2 can input high electric potential, OUT_N+1 can output high electric potential, T10 can be turned on, such that the electric potential of PD can be pulled down.

During the reset stage S3, CLK1 can input a high electric potential, T8 can be turned on, such that the electric potential of PD can be pulled up, T1 and T2 can be both turned on, the electric potential of PU can be pulled down, and OUT_N+1 can output low electric potential to charge C2.

During each stage of the same frame after the reset stage S3, because of the hold function of C2 and the influence of the high electric potential inputted by CLK1, the electric potential of PD can be always at high level, and the electric potential of PU and the gate electrode driving signal outputted by OUT_N+1 can be always in a pulled-down state, as a result, noise can be effectively prevented.

In another aspect, a gate electrode driving circuit can be provided.

The gate electrode driving circuit according to embodiments of the present disclosure can include multiple levels of shift register units according to abovementioned embodiments of the present disclosure.

Figure 19:
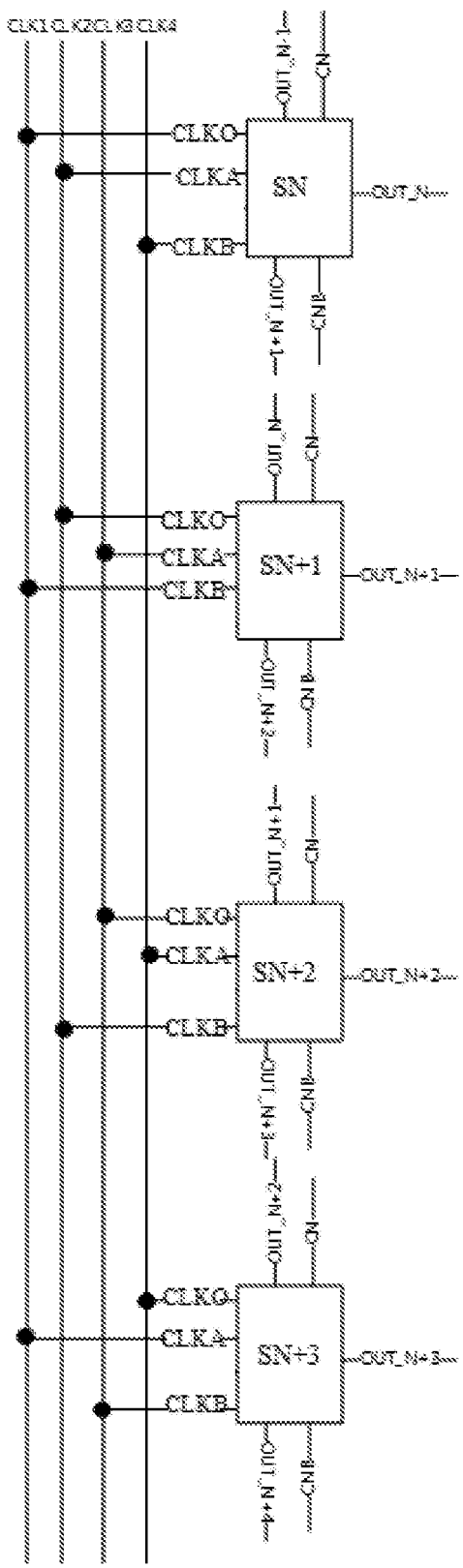
FIG. 19 illustrates a structural diagram of a gate electrode driving circuit including four levels of shift register units according to some embodiments of the present disclosure.

As illustrated in FIG. 19, the N-level shift register unit is marked by SN, the N+1-level shift register unit is marked by SN+1, the N+2-level shift register unit is marked by SN+2, the N+3-level shift register unit is marked by SN+3.

As particularly illustrated in FIG. 19, the forward scan clock signal input terminal is marked by CLKA, the reverse scan clock signal input terminal is marked by CLKB, the output clock signal input terminal is marked by CLKO.

It will then be understood that the first clock signal input terminal is marked by CLK1, the second clock signal input terminal is marked by CLK2, the third clock signal input terminal is marked by CLK3, and the fourth clock signal input terminal is marked by CLK4, the N-level gate electrode signal output terminal is marked by OUT_N, the N+1-level gate electrode signal output terminal is marked by OUT_N+1, the N+2-level gate electrode signal output terminal is marked by OUT_N+2, the N+3-level gate electrode signal output terminal is marked by OUT_N+3; and the forward scan control terminal is marked by CN, the reverse scan control terminal is marked by CNB; wherein, N is a positive integer.

As illustrated in FIG. 19, in this embodiment, CLKO of SN can be connected to CLK1, CLKA of SN can be connected to CLK2, and CLKB of SN can be connected to CLK4.

Also, in this embodiment, CLKO of SN+1 can be connected to CLK2, CLKA of SN+1 can be connected to CLK3, and CLKB of SN+1 can be connected to CLK1.

Also, in this embodiment, CLKO of SN+2 can be connected to CLK3, CLKA of SN+2 can be connected to CLK4, and CLKB of SN+1 can be connected to CLK2.

Also, in this embodiment, CLKO of SN+3 can be connected to CLK4, CLKA of SN+3 can be connected to CLK1, and CLKB of SN+3 can be connected to CLK3.

Also, in this embodiment, SN can be respectively connected to OUT_N_1 and the N−1 level gate electrode driving signal output terminal OUT_N−1; SN+1 can be respectively connected to OUT_N, and OUT_N+2, SN+2 can be respectively connected to OUT_N+1 and OUT_N+3, SN+3 can be respectively connected to OUT_N+2 and the N+4 level gate electrode driving signal output terminal OUT_N+4.

Figure 20A:
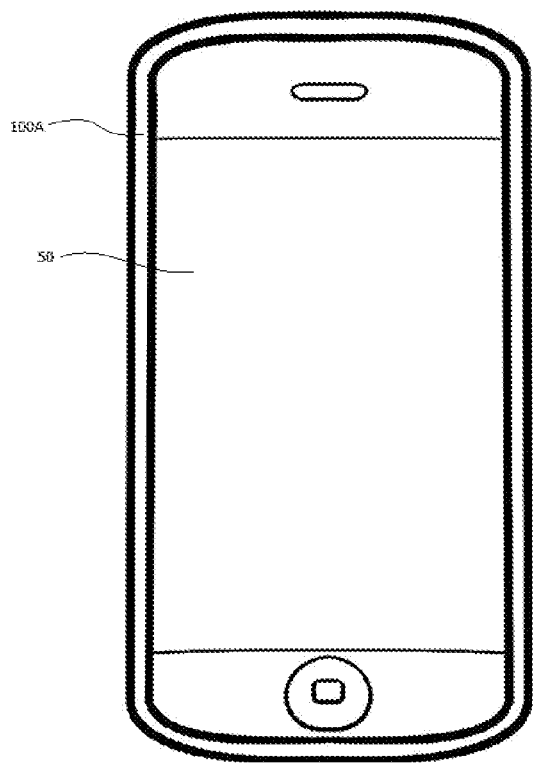
FIG. 20A illustrates a perspective view of an exemplary mobile phone having a display apparatus according to embodiments of the present disclosure which can include the abovementioned gate electrode driving circuits and shift register units.
Figure 20B:
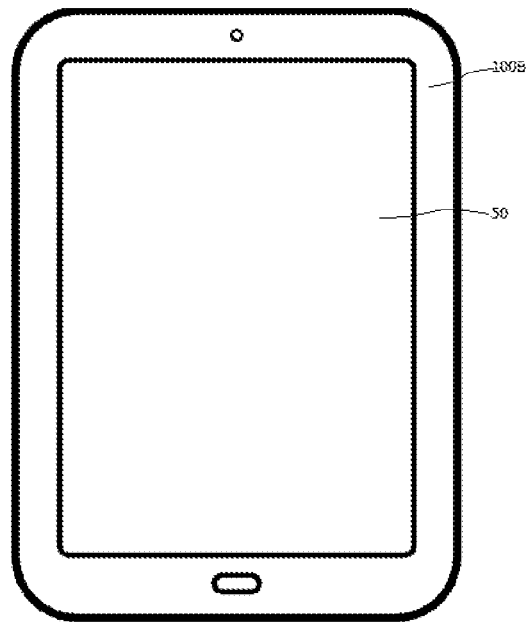
FIG. 20B illustrate a perspective view of an exemplary tablet computer having a display apparatus according to embodiments of the present disclosure which can include the abovementioned gate electrode driving circuits and shift register units.
Figure 20C:
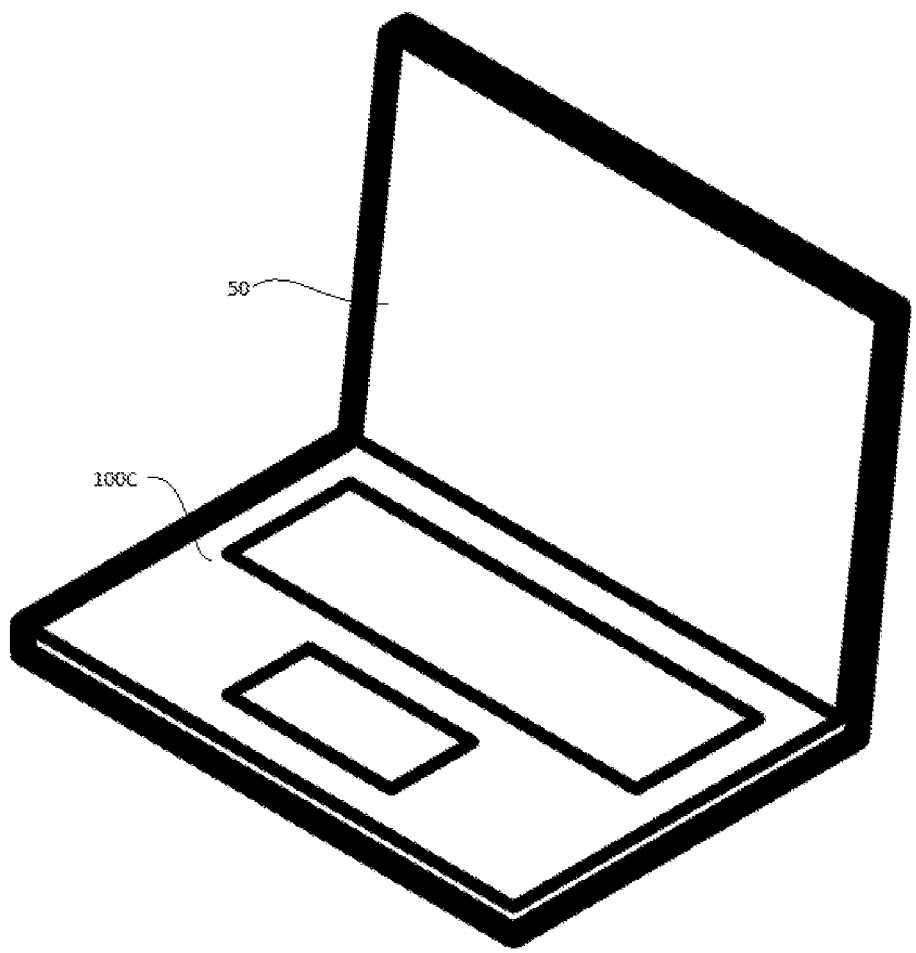
FIG. 20C illustrates a perspective view of an exemplary laptop computer having a display apparatus according to embodiments of the present disclosure which can include the abovementioned gate electrode driving circuits and shift register units.

As illustrated herein in FIGS. 20A, 20B, and 20C, it will then be understood that the shift register unit can be utilized to drive a display 50 which can be implemented within various devices or other apparatus. Wherein, as discussed, the display apparatus according to embodiments of the present disclosure can include the abovementioned gate electrode driving circuits.

As illustrated particularly in FIGS. 20A, 20B, and 20C, the display apparatus can be any electronics products with display functions, such as electronic papers, mobile phones 100A, tablet computers 100B, TV, notebook computers 100C, digital photo frames, wearable devices, or navigators, etc. In such embodiments the devices can include local non-transitory computer-readable media which can contain instructions for implementing the shift register unit, processors configured to execute the requisite instructions or commands, power supplies, and any other hardware required to properly utilize the shift register units as disclosed herein.

Various embodiments of the present disclosure can have one or more of the following advantages.

The shift register unit, the gate electrode driving circuit and display apparatus in various embodiments of the present disclosure can maintain the electric potential of the pull-up node during the gate electrode driving signal output stage such that the gate electrode driving signals can be outputted normally.

The foregoing has provided a detailed description on a shift register unit, a gate electrode driving circuit and a display apparatus according to some embodiments of the present disclosure. Specific examples are used herein to describe the principles and implementations of some embodiments. The description is only used to help understanding some of the possible methods and concepts. Meanwhile, those of ordinary skill in the art can change the specific implementation manners and the application scope according to the concepts of the present disclosure. The contents of this specification therefore should not be construed as limiting the disclosure, In addition, those of ordinary skill in the art will also understand that the embodiments described in the specification are just some of the embodiments, and the involved actions and portions are not necessarily all required to realize the functions of the various embodiments.

Various embodiments in this specification have been described in a progressive manner, where descriptions of some embodiments focus on the differences from other embodiments, and same or similar parts among the different embodiments are sometimes described together in only one embodiment.

It should also be noted that in the present disclosure, relational terms such as first and second, etc., are only used to distinguish one entity or operation from another entity or operation, and do not necessarily require or imply these entities having such an order or sequence. It does not necessarily require or imply that any such actual relationship or order exists between these entities or operations.

Moreover, the terms "include," "including," or any other variations thereof are intended to cover a non-exclusive inclusion such that a process, method, article, or apparatus that comprises a list of elements including not only those elements but also those that are not explicitly listed, or other elements that are inherent to such processes, methods, goods, or equipment.

In the case of no more limitation, the element defined by the sentence "includes a . . . " does not exclude the existence of another identical element in the process, the method, the commodity, or the device including the element.

In the descriptions, with respect to device(s), terminal(s), etc., in some occurrences singular forms are used, and in some other occurrences plural forms are used in the descriptions of various embodiments. It should be noted, however, that the single or plural forms are not limiting but rather are for illustrative purposes. Unless it is expressly stated that a single device, or terminal, etc. is employed, or it is expressly stated that a plurality of devices, or terminals, etc. are employed, the device(s), terminal(s), etc. can be singular, or plural.

Based on various embodiments of the present disclosure, the disclosed apparatuses, devices, and methods can be implemented in other manners. For example, the abovementioned terminals devices are only of illustrative purposes, and other types of terminals and devices can employ the methods disclosed herein.

Dividing the terminal or device into different "portions," "regions" "or "components" merely reflect various logical functions according to some embodiments, and actual implementations can have other divisions of "portions," "regions," or "components" realizing similar functions as described above, or without divisions. For example, multiple portions, regions, or components can be combined or can be integrated into another system. In addition, some features can be omitted, and some steps in the methods can be skipped.

Those of ordinary skill in the art will appreciate that the portions, or components, etc. in the devices provided by various embodiments described above can be configured in the one or more devices described above. They can also be located in one or multiple devices that is (are) different from the example embodiments described above or illustrated in the accompanying drawings. For example, the circuits, portions, or components, etc. in various embodiments described above can be integrated into one module or divided into several sub-modules.

The numbering of the various embodiments described above are only for the purpose of illustration, and do not represent preference of embodiments.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation to encompass such modifications and equivalent structures.

What is claimed is:

1. A shift register unit, comprising:
an output circuit; and
a storage circuit;
wherein:
the output circuit is respectively connected to a pull-up node, a gate electrode driving signal output terminal that is connected to a pull-down node, and an output voltage signal input terminal, the output circuit being configured to connect or disconnect the gate electrode driving signal output terminal and the output voltage signal input terminal under control of an electric potential of the pull-up node;
the storage circuit is respectively connected to the pull-up node and the gate electrode driving signal output terminal; and
the storage circuit is configured to control the electric potential of the pull-up node during a gate electrode driving signal output stage, such that the output circuit is configured to connect the gate electrode driving signal output terminal and the output voltage signal input terminal;
the shift register unit further comprising:
a pull-down node reset circuit, the pull-down node reset circuit being respectively connected to the pull-down node, the gate electrode driving signal output terminal, and a pull-down reset voltage input terminal;
wherein the pull-down node reset circuit is configured to connect or disconnect the pull-down reset voltage input terminal and the pull-down node under the control of the gate electrode driving signal output terminal.

2. The shift register unit according to claim 1, wherein:
the storage circuit comprises a first storage capacitor;
the first terminal of the first storage capacitor is connected to the pull-up node; and
the second terminal of the first storage capacitor is connected to the gate electrode driving signal output terminal.

3. The shift register unit according to claim 1, wherein:
the pull-down node reset circuit further comprises a pull-down node reset transistor;
wherein:
the gate electrode of the pull-down node reset transistor is connected to the gate electrode driving signal output terminal, wherein the first electrode of the pull-down node reset transistor is connected to the pull-down node; and
wherein the second electrode of the pull-down node reset transistor is connected to the pull-down reset voltage input terminal.

4. The shift register unit according to claim 3, wherein:
the pull-down node reset circuit also includes a holding capacitor being provided between a signal side and an electrical connection side of the pull-down node; and the holding capacitor is configured to maintain an output potential of the output transistor.

5. The shift register unit according to claim 3, further comprising:
an output reset circuit provided connected between the pull-down node and the gate electrode driving a signal output terminal;
a pull-down node control circuit operatively connected to the output reset circuit, the pull-down-node, and
a pull-up node control circuit, the pull-up node control circuit being operatively connected to the output circuit and the pull-up node;
wherein:
the pull-down node control circuit is connected to a forward scan control, the forward scan control terminal being provided at an input side of the pull-up node control unit; and
the pull-down node control circuit is connected between the pull-down node and a reverse scan control terminal, the reverse scan control terminal being provided at an input side of the pull-up node control unit independent from the forward scan control terminal.

6. The shift register unit according to claim 1, wherein:
the output circuit comprises an output transistor, wherein the gate electrode of the output transistor is connected to the pull-up node;
the first electrode of the output transistor is connected to the output voltage signal input terminal; and
the second electrode of the output transistor is connected to the gate electrode driving signal output terminal.

7. The shift register unit of claim 6, wherein the output voltage signal input terminal is an output clock signal input terminal.

8. A gate electrode driving circuit, comprising a plurality of levels of shift register units, each shift level unit being provided in accordance with the shift register unit of claim 1.

9. A display apparatus comprising the gate electrode driving circuits according to claim 8.

10. A shift register unit, comprising:
an output circuit; and
a storage circuit;
wherein:
the output circuit is respectively connected to a pull-up node, a gate electrode driving signal output terminal that is connected to a pull-down node, and an output voltage signal input terminal, the output circuit being configured to connect or disconnect the gate electrode driving signal output terminal and the output voltage signal input terminal under control of an electric potential of the pull-up node;
the storage circuit is respectively connected to the pull-up node and the gate electrode driving signal output terminal;
the storage circuit is configured to control the electric potential of the pull-up node during a gate electrode driving signal output stage, such that the output circuit is configured to connect the gate electrode driving signal output terminal and the output voltage signal input terminal;
the output circuit comprises an output transistor, wherein the gate electrode of the output transistor is connected to the pull-up node;
the first electrode of the output transistor is connected to the output voltage signal input terminal; and
the second electrode of the output transistor is connected to the gate electrode driving signal output terminal;
the shift register unit further comprising:
an output reset circuit;
a pull-up node control circuit; and
a pull-down node control circuit;
wherein:
the output reset circuit is respectively connected to the pull-down node, the gate electrode driving signal output terminal and a first voltage input terminal, and configured to connect or disconnect the gate electrode driving circuit output terminal and the first voltage input terminal under a control of an electric potential of the pull-down node;
the pull-up node control circuit is connected to the pull-up node, and configured to control the electric potential of the pull-up node; and
the pull-down node control circuit is connected to the pull-down node, and configured to control the electric potential of the pull-down node.

11. The shift register unit according to claim 10, wherein:
the pull-up node control circuit is further respectively connected to the pull-down node, an adjacent upper level gate electrode driving signal output terminal, an adjacent lower level gate electrode driving signal output terminal, and a forward scan control terminal and a reverse scan control terminal; and
the pull-up node control circuit is configured to connect or disconnect the pull-up node and the first voltage input terminal under the control of the pull-down node, connect or disconnect the forward scan control terminal and the pull-up node under the control of the adjacent upper level gate driving signal output terminal, and connect or disconnect the reverse scan control terminal and the pull-up node under the control of the adjacent lower level gate driving signal output terminal.

12. The shift register unit according to claim 11, wherein:
the pull-up node control circuit comprises a first pull-up control transistor, a second pull-up control transistor, and a third pull-up control transistor;
the gate electrode of the first pull-up control transistor is connected to the adjacent upper level gate electrode driving signal output terminal;
the first electrode of the first pull-up control transistor is connected to the pull-up node;
the second electrode of the first pull-up control transistor is connected to the forward scan control terminal;
the gate electrode of the second pull-up control transistor is connected to the lower level gate electrode driving signal output terminal;
the first electrode of the second pull-up control transistor is connected to the reverse scan control terminal;
the second electrode of the second pull-up control transistor is connected to the pull-up node;
the gate electrode of the third pull-up control transistor is connected to the pull-down node;
the first electrode of the third pull-up control transistor is connected to the pull-up node; and
the second electrode of the third pull-up control transistor is connected to the first voltage input terminal.

13. The shift register unit according to claim 10, wherein:
the pull-down node control circuit is further connected to the pull-up node, a forward scan control terminal, a forward scan clock signal input terminal, a reverse scan control terminal, a reverse scan clock signal input terminal, the first voltage input terminal, and a second voltage input terminal;
the pull-down node control circuit is configured to connect or disconnect the forward scan clock signal input terminal and a pull-down control node under the control of the forward scan control terminal, connect or disconnect the reverse scan clock signal input terminal and the pull-down control node under the control of the reverse scan control terminal, connect or disconnect the pull-down node and the second voltage input terminal under the control of the electric potential of the pull-down control node, and connect or disconnect the pull-down node and the first voltage input terminal under the control of the pull-up node.

14. The shift register unit according to claim 13, wherein:
the pull-down node control circuit comprises a first pull-down control transistor, a second pull-down control transistor, a third pull-down control transistor and a fourth pull-down control transistor;
the gate electrode of the first pull-down control transistor is connected to the forward scan control terminal;
the first electrode of the first pull-down control transistor is connected to the forward scan clock signal input terminal;
the second electrode of the first pull-down control transistor is connected to the pull-down control node;
the gate electrode of the second pull-down control transistor is connected to the reverse scan control terminal;
the first electrode of the second pull-down control transistor is connected to the reverse scan clock signal input terminal;
the second electrode of the second pull-down control transistor is connected to the pull-down control node;
the gate electrode of the third pull-down control transistor is connected to the pull-down control node;
the first electrode of the third pull-down control transistor is connected to the pull-down node;
the second electrode of the third pull-down control transistor is connected to the second voltage input terminal;
the gate electrode of the fourth pull-down control transistor is connected to the pull-up node;

the first electrode of the fourth pull-down control transistor is connected to the first voltage input terminal; and
the second electrode of the fourth pull-down control transistor is connected to the pull-down node.

15. The shift register unit according to claim 13, wherein:
the shift register unit is provided with a first input clock terminal, a second input clock terminal, a third input clock terminal, and a fourth input clock terminal, wherein the forward scan clock signal input terminal is the third input clock terminal;
the reverse scan clock signal input terminal is the first input clock terminal;
the first voltage input terminal is a low voltage terminal; and
the second voltage input terminal is a high voltage terminal.

16. The shift register unit according to claim 15, wherein:
the first input clock terminal is configured to receive input regarding a first clock signal;
the second input clock terminal is configured to receive input regarding a second clock signal;
the third input clock terminal is configured to receive input regarding a third clock signal; and
wherein the fourth input clock terminal is configured to receive input regarding a fourth clock signal.

17. The shift register unit according to claim 16, wherein:
the period of the first clock signal, the period of the second clock signal, the period of the third clock signal, and the period of the fourth clock signal are equal, and a total period is defined as T; and
the duty ratio of the first clock signal, the duty ratio of the second clock signal, the duty ratio of the third clock signal and the duty ratio of the fourth clock signal are all ¼T.

18. The shift register unit according to claim 10, wherein the output reset circuit comprises:
an output reset transistor, wherein a gate electrode of the output reset transistor is connected to the pull-down node, wherein a first electrode of the output reset transistor is connected to the gate electrode driving signal output terminal, wherein a second electrode of the output reset transistor is connected to the first voltage input terminal; and
a second storage capacitor, wherein a first terminal of the second storage capacitor is connected to the pull-down node, and wherein a second terminal of the second storage capacitor is connected to the first voltage input terminal.

* * * * *